(12) United States Patent
Lee et al.

(10) Patent No.: US 12,237,045 B2
(45) Date of Patent: Feb. 25, 2025

(54) NONVOLATILE MEMORY DEVICE, CONTROLLER FOR CONTROLLING THE SAME, STORAGE DEVICE HAVING THE SAME, AND OPERATING METHOD THEREOF

(71) Applicant: SAMSUNG ELECTRONICS CO., LTD., Suwon-si (KR)

(72) Inventors: Youngmin Lee, Suwon-si (KR); Myeonghwan Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 89 days.

(21) Appl. No.: 17/965,326

(22) Filed: Oct. 13, 2022

(65) Prior Publication Data

US 2023/0170002 A1  Jun. 1, 2023

(30) Foreign Application Priority Data

Dec. 1, 2021  (KR) ................... 10-2021-0170105

(51) Int. Cl.
*G11C 7/10* (2006.01)

(52) U.S. Cl.
CPC ............ *G11C 7/1063* (2013.01); *G11C 7/106* (2013.01); *G11C 7/1066* (2013.01); *G11C 7/1069* (2013.01)

(58) Field of Classification Search
CPC ..... G11C 16/08; G11C 16/26; G11C 11/5642; G11C 16/0483; G11C 16/3431; G11C 16/349; G11C 2211/5631; G11C 2211/5644; G11C 29/021; G11C 29/028; G11C 29/44; G11C 29/52; G11C 7/04; G11C 2216/30; G11C 5/066; G11C 7/106; G11C 7/1063; G11C 7/1066; G11C 7/1069; G11C 16/32; H04L 69/18; H04L 65/1069; H04L 65/1101; H04L 65/61; H04L 65/80; H04L 69/22; H04L 69/32; H04L 12/40071; H04L 12/40117; H04L 69/324; H04L 9/40; H04L 12/40; H04L 12/40052;
(Continued)

(56) References Cited

U.S. PATENT DOCUMENTS 7,679,133 B2  3/2010  Son et al.
7,843,758 B2  11/2010  Byeon
(Continued)

FOREIGN PATENT DOCUMENTS

JP     2008-515003 A    5/2008
KR  10-2010-0089509 A   8/2010
(Continued)

OTHER PUBLICATIONS

Communication issued Apr. 6, 2023 by the European Patent Office in counterpart EP Patent Application No. 22209764.4.

*Primary Examiner* — Thong Q Le
(74) *Attorney, Agent, or Firm* — Sughrue Mion, PLLC

(57) ABSTRACT

An operating method of a controller includes transmitting an extended status check command to a nonvolatile memory device, toggling a read activation signal /RE to correspond to the number of planes inside the nonvolatile memory device, after transmitting the extended status check command, and receiving status information of planes of the nonvolatile memory device through data lines according to a data strobe signal DQS corresponding to the read activation signal /RE.

25 Claims, 17 Drawing Sheets

(58) Field of Classification Search
CPC ... H04L 12/6418; H04L 47/283; H04L 65/65; H04L 65/756; H04L 69/03; H04L 69/10; H04L 69/12; H04L 69/24; H04L 69/323
See application file for complete search history.

(56) References Cited

U.S. PATENT DOCUMENTS

| | | | |
|---|---|---|---|
| 7,978,516 B2 | 7/2011 | Olbrich et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,536,970 B2 | 1/2017 | Seol et al. | |
| 9,792,995 B1* | 10/2017 | Shah | G11C 7/1039 |
| 10,191,692 B2 | 1/2019 | Shin | |
| 10,261,697 B2* | 4/2019 | Lee | G06F 3/0656 |
| 10,720,221 B2 | 7/2020 | Yamamoto et al. | |
| 10,877,696 B2 | 12/2020 | Wakchaure et al. | |
| 11,062,742 B2 | 7/2021 | Park et al. | |
| 2003/0117851 A1 | 6/2003 | Lee et al. | |
| 2018/0275918 A1 | 9/2018 | Tanefusa | |
| 2018/0336936 A1 | 11/2018 | Chae | |
| 2019/0171378 A1 | 6/2019 | Kim et al. | |
| 2019/0235786 A1 | 8/2019 | Chun | |
| 2020/0285388 A1 | 9/2020 | Shirakawa et al. | |
| 2021/0055887 A1 | 2/2021 | Sugahara et al. | |
| 2021/0064258 A1 | 3/2021 | Sakurai et al. | |
| 2021/0097010 A1 | 4/2021 | Kim et al. | |
| 2021/0389878 A1* | 12/2021 | Lindberg | G06F 3/0659 |

FOREIGN PATENT DOCUMENTS

| | | |
|---|---|---|
| KR | 10-2017-0005900 A | 1/2017 |
| KR | 10-2018-0126321 A | 11/2018 |
| KR | 10-2019-0093364 A | 8/2019 |
| KR | 10-2021-0039075 A | 4/2021 |

* cited by examiner

| Plane Bitmap Value | Target Plane |
|---|---|
| DQ[0] | Plane 1 |
| DQ[1] | Plane 2 |
| DQ[2] | Plane 3 |
| DQ[3] | Plane 4 |
| DQ[4] | Plane 5 |
| DQ[5] | Plane 6 |
| DQ[6] | Plane 7 |
| DQ[7] | Plane 8 |

FIG. 8B

| Plane ADD | Target Plane |
|---|---|
| ADD1 | Plane 1 ~ Plane 8 |
| ADD2 | Plane 9 ~ Plane 16 |
| ADD3 | Plane 17 ~ Plane 24 |
| ADD4 | Plane 25 ~ Plane 32 |

FIG. 9B

NONVOLATILE MEMORY DEVICE, CONTROLLER FOR CONTROLLING THE SAME, STORAGE DEVICE HAVING THE SAME, AND OPERATING METHOD THEREOF

CROSS-REFERENCE TO RELATED APPLICATION(S)

This application is based on and claims priority from Korean Patent Application No. 10-2021-0170105 filed on Dec. 1, 2021 in the Korean Intellectual Property Office, the entire disclosure of which is incorporated herein in its entirety by reference.

BACKGROUND

1. Field

The disclosure relates to a nonvolatile memory device, a controller for controlling the same, a storage device having the same, and an operating method thereof.

2. Description of Related Art

In general, a storage device having a nonvolatile memory device is widely used in universal serial bus (USB) drives, digital cameras, mobile phones, smartphones, tablets, PCs, memory cards, and solid state drives (SSDs). A storage device is used to store or move a large amount of data. Recently, storage devices have been miniaturized and implemented in an embedded form in electronic devices.

SUMMARY

Example embodiments provide a nonvolatile memory device that reduces an area, while supporting a plane independent command (PIC), a controller for controlling the same, a storage device having the same, and an operating method thereof.

Example embodiments also provide a nonvolatile memory device having a minimized area, which can quickly determine a state of each plane, a controller for controlling the same, a storage device having the same, and an operating method thereof.

According to an aspect of the disclosure, there is provided an operating method of a controller, the operating method including: transmitting an extended status check command to a nonvolatile memory device; after transmitting the extended status check command, toggling a read activation signal to correspond to a number of planes in the nonvolatile memory device; and receiving status information about one or more planes in the nonvolatile memory device through data lines according to a data strobe signal corresponding to the read activation signal.

The operating method further including determining the number of planes of the nonvolatile memory device.

Information corresponding to the number of planes may be stored in a read only memory (ROM) or an E-fuse in the controller.

The determining the number of planes may include: transmitting a get feature command to the nonvolatile memory device; receiving plane number information from the nonvolatile memory device based on the get feature command; and storing the plane number information in a buffer memory.

The read activation signal may be output after a first period of time from a point in time when the extended status check command is received.

The read activation signal may be toggled after a read preamble time.

The data strobe signal may be toggled to correspond to the number of planes based on the read activation signal after an access window.

After the read activation signal is toggled, the read activation signal may have a read postamble time until a chip activation signal, a command latch activation signal, and an address latch activation signal transition from a low level to a high level, and wherein the data strobe signal may be toggled during the read postamble time.

The read activation signal ma have a read postamble holding time to ensure a data output time after the read postamble time, and wherein the status information about the one or more planes may include a last plane status information, which is maintained in the data lines during the read postamble holding time.

The extended status check command may be a 77h command.

According to another aspect of the disclosure, there is provided an operating method of a controller, the operating method including: transmitting an extended status check command to a nonvolatile memory device; transmitting a plane bitmap value in an address cycle to the nonvolatile memory device, the plane bitmap indicating at least one plane, among a plurality of planes of the nonvolatile memory device; toggling a read activation signal to correspond to a number of planes indicated by the plane bitmap value; and receiving status information about the at least one plane indicated by the plane bitmap value according to a data strobe signal corresponding to the read activation signal through data lines.

The read activation signal may be output after a first time period from a point in time when the plane bitmap value is received.

According to the operation method, corresponding numbers of the planes may be sequentially allocated from a least significant bit of the plane bitmap value.

When the number of planes exceeds 8, an address cycle corresponding to a number of exceeding planes is added.

The extended status check command may be a 79h command.

According to another aspect of the disclosure, there is provided a controller including: a nonvolatile memory interface circuit connected to a nonvolatile memory device through a plurality of control pins and data lines and configured to control the nonvolatile memory device; and a memory device configured to store plane number information about the nonvolatile memory device, wherein the nonvolatile memory interface circuit is configured to: transmit an extended status check command to the nonvolatile memory device to determine a plane status of the nonvolatile memory device, toggle a read activation signal to correspond to the plane number information, and receive plane status information about the nonvolatile memory device through the data lines based on a data strobe signal corresponding to toggling of the read activation signal.

The nonvolatile memory interface circuit may be further configured to: transmit a get feature command to the nonvolatile memory device, and receive plane independent read/plane independent command (PIR/PIC) information having the plane number information from the nonvolatile memory device according to the get feature command.

The memory device may be implemented as a nonvolatile memory.

The controller may further include: a first-in first-out (FIFO) memory configured to store the plane status information, wherein the nonvolatile memory interface circuit is further configured to transmit an input/output request having a plane independent command (PIC) to the nonvolatile memory device based on the plane status information.

The nonvolatile memory interface circuit may be further configured to transmit an input/output request having a plane independent command (PIC) to the nonvolatile memory device based on status information about a plane selected from one or more planes of the nonvolatile memory device.

According to another aspect of the disclosure, there is provided a nonvolatile memory device including: a plurality of planes; and a control logic configured to control an input/output operation of each of the plurality of planes, wherein each of the plurality of planes includes at least two strings between each of bit lines and a common source line, and wherein each of the at least two strings includes: at least one string select transistor connected in series between one of the bit lines and the common source line, a plurality of memory cells, and at least one ground transistor, wherein the at least one string select transistor has a gate connected to a string selection line, wherein each of the plurality of memory cells is provided with a word line voltage from a corresponding word line, and wherein the at least one ground transistor includes a plurality of memory blocks having a gate connected to a ground selection line, and wherein the control logic is configured to: receive an extended status check command from an external device, and output plane status information about each of the plurality of planes to the external device through data lines based on the extended status check command.

The plane status information may be output to correspond to toggling of a read activation signal.

The control logic may be further configured to receive a plane bitmap value indicating at least one of the plurality of planes in an address cycle.

The plane status information may be obtained from a ready and busy signal corresponding to each of the plurality of planes.

The nonvolatile memory device may further include a pin configured to output a ready and busy signal to the outside, wherein the ready and busy signal is in a floating state.

According to another aspect of the disclosure, there is provided a storage device including: at least one nonvolatile memory device; and a controller configured to control the at least one nonvolatile memory device, wherein the controller includes: control pins configured to provide control signals to the at least one nonvolatile memory device; and a nonvolatile memory interface circuit configured to control the at least one nonvolatile memory device, wherein the nonvolatile memory interface circuit is configured to: output an extended status check command to the at least one nonvolatile memory device to determine a plane status, and receive plane status information from the at least one nonvolatile memory device through data lines.

The extended status check command may be one of a 77h command and a 79h command.

The nonvolatile memory interface circuit may be further configured to transmit an input/output request having a plane independent command (PIC) to the at least one nonvolatile memory device using the plane status information.

The controller may further include a memory device storing plane number information, and wherein the nonvolatile memory interface circuit is further configured to toggle a read activation signal /RE to correspond to the plane number information after transmitting the extended status check command.

The nonvolatile memory interface circuit may further configured to receive a ready and busy signal in a floating state from the at least one nonvolatile memory device.

According to another aspect of the disclosure, there is provided a nonvolatile memory device including: a memory cell region having a first metal pad; and a memory cell array including a peripheral circuit region having a second metal pad and vertically connected to the first metal pad through the second metal pad, the memory cell array including a plurality of memory blocks having a plurality of memory cells connected to a plurality of word lines and a plurality of bit lines in the memory cell region; a row decoder configured to select one of the plurality of word lines in the peripheral circuit region; a page buffer circuit having a plurality of page buffers connected to the plurality of bit lines in the peripheral circuit region; and a control logic provided in the peripheral circuit region, the control logic configured to: receive a command latch activation signal, an address latch activation signal, a chip activation signal, a write activation signal, a read activation signal, and a data strobe signal, receive an extended status check command at an edge of the write activation signal according to the command latch activation signal and the address latch activation signal, and output plane status information about the nonvolatile memory device to correspond to toggling of the read activation signal based on the extended status check command.

BRIEF DESCRIPTION OF DRAWINGS

The above and other aspects, features, and advantages of the disclosure will be more clearly understood from the following detailed description, taken in conjunction with the accompanying drawings, in which:

FIGS. 8A and 8B are diagrams illustrating a method of selectively determining a plane status using a plane bitmap value according to an example embodiment of the disclosure;

FIGS. 9A and 9B are diagrams illustrating a method of selectively determining a plane state using a plane bitmap value according to another example embodiment of the disclosure;

DETAILED DESCRIPTION

Hereinafter, example embodiments will be described with reference to the accompanying drawings. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In general, a nonvolatile memory device may include a plurality of planes. Here, each of the planes may include a memory cell array, a row decoder, and page buffers. In an example embodiment, the memory cell array may include a plurality of memory blocks. Here, each of the plurality of memory blocks may include a plurality of memory cells connected to word lines and bit lines. Here, each of the plurality of memory cells may store at least one bit. The row decoder may be implemented to select one of a plurality of word lines based on an address. According to an example embodiment, the row decoder may be implemented to select one of a plurality of word lines in response to receiving the address. In an example embodiment, the page buffers may be connected to a plurality of bit lines and may write data to a corresponding memory cell or read data from a corresponding memory cell. Each of the planes may perform a write operation or a read operation. According to an example embodiment, each of the planes may independently perform a write operation or a read operation. That is, the nonvolatile memory device may independently perform a write operation or a read operation according to a plane in response to a multi-plane write command or a multi-plane read command.

A nonvolatile memory device, a controller for controlling the nonvolatile memory device, a storage device having the nonvolatile memory device, and an operating method of the nonvolatile memory device according to an example embodiment of the disclosure may obtain status information about each plane inside the nonvolatile memory device using an extended status check command.

Figure 1:
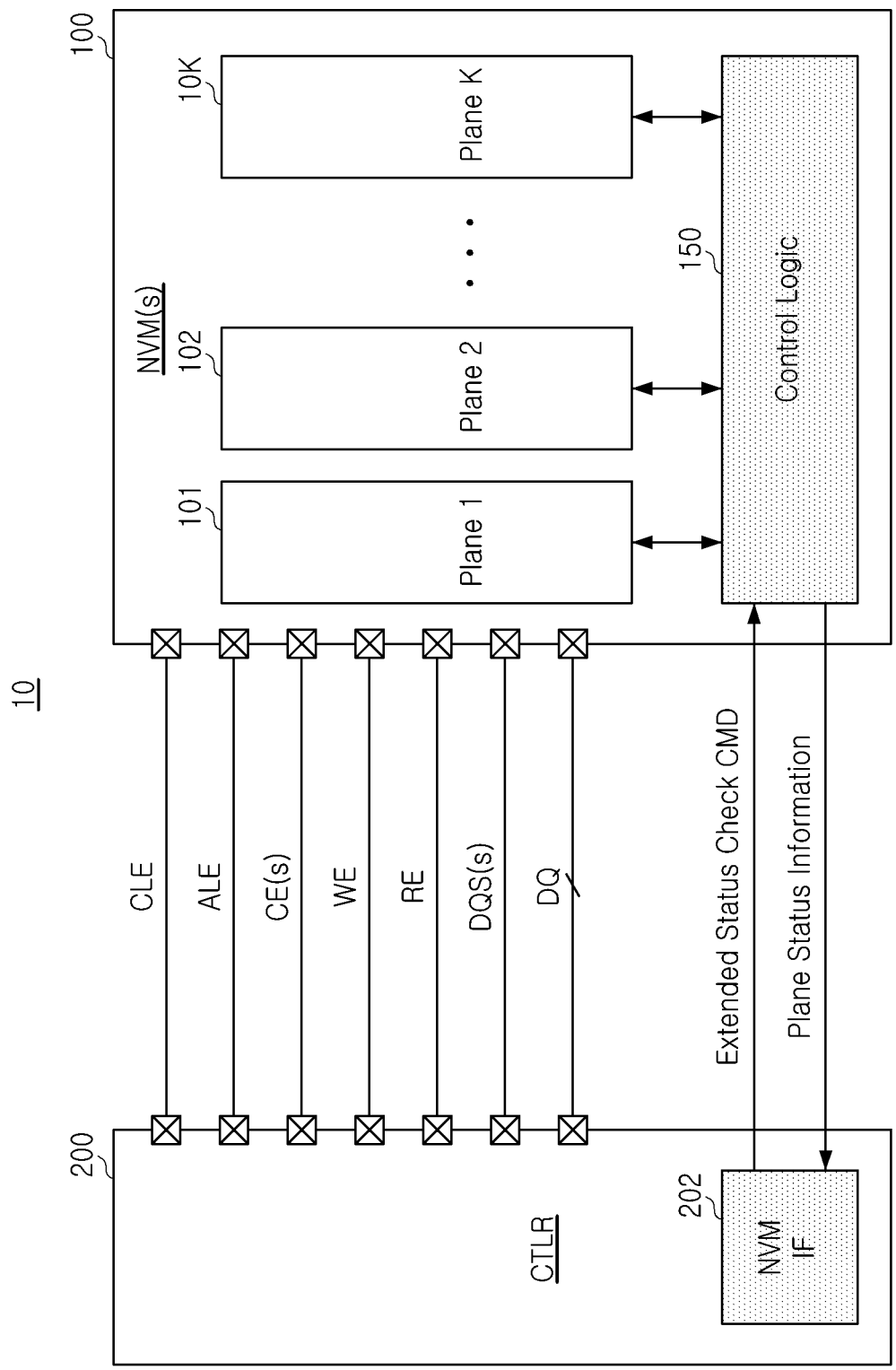
FIG. 1 is a block diagram illustrating a storage device according to an example embodiment of the disclosure.

FIG. 1 is a diagram exemplarily illustrating a storage device 10 according to an example embodiment of the disclosure. Referring to FIG. 1, the storage device 10 may include at least one nonvolatile memory device (NVM(s)) 100 and a controller (CTRL) 200.

At least one nonvolatile memory device 100 may be implemented to store data. The nonvolatile memory device 100 may include a NAND flash memory, a vertical NAND flash memory, a NOR flash memory, a resistive random access memory (RRAM), a phase-change memory (PRAM), magnetoresistive random access memory (MRAM), ferroelectric random access memory (FRAM), spin transfer torque random access memory (STT-RAM), etc. Also, the nonvolatile memory device 100 may be implemented as a three-dimensional array structure. The disclosure is not limited to a flash memory device in which a charge storage layer is formed of a conductive floating gate, and as such, according to another example embodiment, the features of the disclosure may be applicable to a charge trap flash (CTF) in which a charge storage layer is formed of an insulating film. Hereinafter, for convenience of description, the nonvolatile memory device 100 will be referred to as a vertical NAND flash memory device (VNAND).

In addition, the nonvolatile memory device 100 may be implemented to include a control logic 150 and a plurality of planes 101, 102, . . . , 10K, (where K is an integer greater than or equal to 2). According to an example embodiment, the nonvolatile memory device 100 may support a plane independent command (PIC).

The control logic 150 may be implemented to control the operation of each of the planes 101, 102, . . . , 10K. According to an example embodiment, the control logic 150 may receive an extended status check command from the controller 200 and output status information about the planes 101, 102, . . . , 10K based on the extended status check command. According to an example embodiment, the control logic 150 may receive the extended status check command from the controller 200, and output status information about the planes 101, 102, . . . , 10K in response to the extended status check command. Also, the control logic 150 may store status information about the planes 101, 102, . . . , 10K. Here, the status information may be information corresponding to a ready and busy (RnB) signal of each plane.

In an example embodiment, the plane status information may be output to data lines DQ based on a toggled RE signal. According to an example embodiment, the plane status information may be output to data lines DQ in response to a toggled RE signal. Meanwhile, it should be understood that the output of the plane status information about the disclosure is not limited thereto. As such, according to another example embodiment, In the plane status information may be output through another manner.

The control logic 150 may be implemented to receive a command and an address from the controller (CTRL) 200 and perform an operation (a write operation, a read operation, an erase operation, etc.) corresponding to the received command on memory cells corresponding to an address.

The controller (CTRL) 200 may be connected to at least one nonvolatile memory device 100 through a plurality of control pins transmitting control signals. For example, the control signals may include a command latch enable (CLE) signal, an address latch enable (ALE) signal, chip activation signals CE(s), a write enable (WE) signal and a read enable (RE) signal, but the disclosure is not limited to these signals. Also, the controller (CTRL) 200 may be implemented to control the nonvolatile memory device 100 using control signals (CLE, ALE, CE(s), WE, RE, etc.). For example, the nonvolatile memory device 100 may perform a write operation/read operation/erase operation by latching a command CMD or an address ADD at an edge of a write enable (WE) signal according to a command latch enable (CLE) signal and an address latch enable (ALE) signal. For example, during a read operation, a chip activation signal CE may be activated, CLE may be activated during a command transmission interval, ALE may be activated during an address transmission interval, and RE may be toggled in an interval during which data is transmitted through the data signal line DQ. The data strobe signal DQS may be toggled with a frequency corresponding to a data input/output speed. The read data may be sequentially transmitted in synchronization with the data strobe signal DQS.

Also, the controller 200 may be implemented to control an overall operation of the storage device 10. The controller 200 may perform various management operations, such as cache/buffer management, firmware management, garbage collection management, wear leveling management, data deduplication management, read refresh/reclaim management, bad block management, multi-stream management, mapping management of host data and nonvolatile memory, quality of service (QOS) management, system resource allocation management, nonvolatile memory queue management, read level management, erase/write management, hot/cold data management, power loss protection management, dynamic thermal management, initialization management, redundant array of inexpensive disk (RAID) management, and the like.

Also, the controller 200 may include a nonvolatile memory interface circuit (NVM IF) 202 for performing data communication with the nonvolatile memory device 100.

The nonvolatile memory interface circuit 202 may be connected to the nonvolatile memory device 100 by the plurality of control pins described above. According to an example embodiment, the nonvolatile memory interface circuit 202 may support an extended command protocol. For example, the nonvolatile memory interface circuit 202 may issue an extended status check command to determine a plane state of the nonvolatile memory device 100. The nonvolatile memory interface circuit 202 may receive plane status information from the nonvolatile memory device 100 through the data lines DQ to correspond to the extended status check command. Here, the plane status information may include read pass/fail information, write pass/fail information, ready/busy information, and the like.

The storage device 10 according to an example embodiment of the disclosure, including the nonvolatile memory device 100 supporting a plane independent command (PIC) and the controller 200 having the nonvolatile memory interface circuit 202 supporting an extended command protocol, may output all or part of plane status information about the nonvolatile memory device 100 through a data line in response to the extended status check command of the controller 200. Accordingly, the storage device 10 of the disclosure may efficiently manage the nonvolatile memory device 100 by using the plane status information.

Figure 2A:
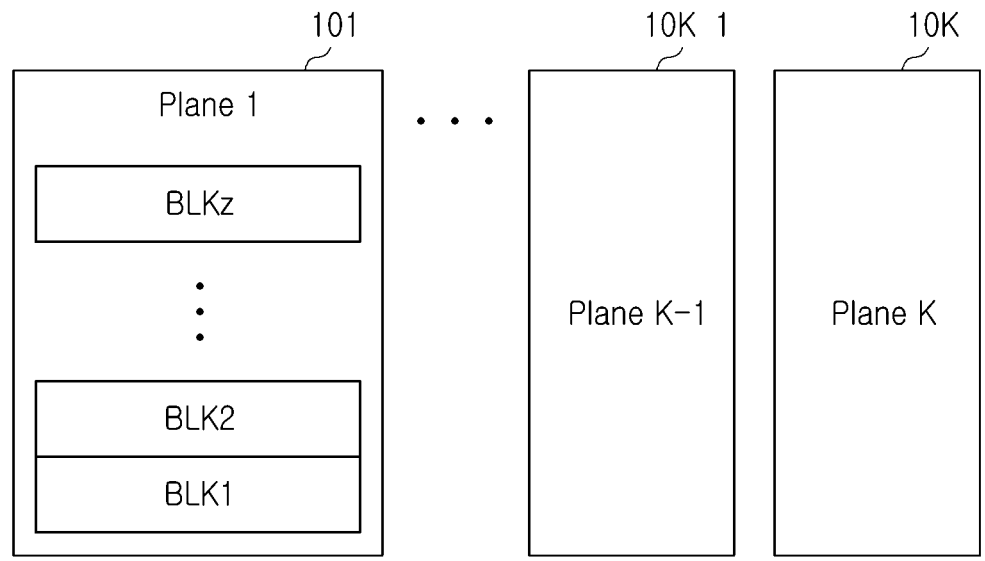
FIG. 2A is a diagram illustrating a plurality of planes of the disclosure.
Figure 2B:
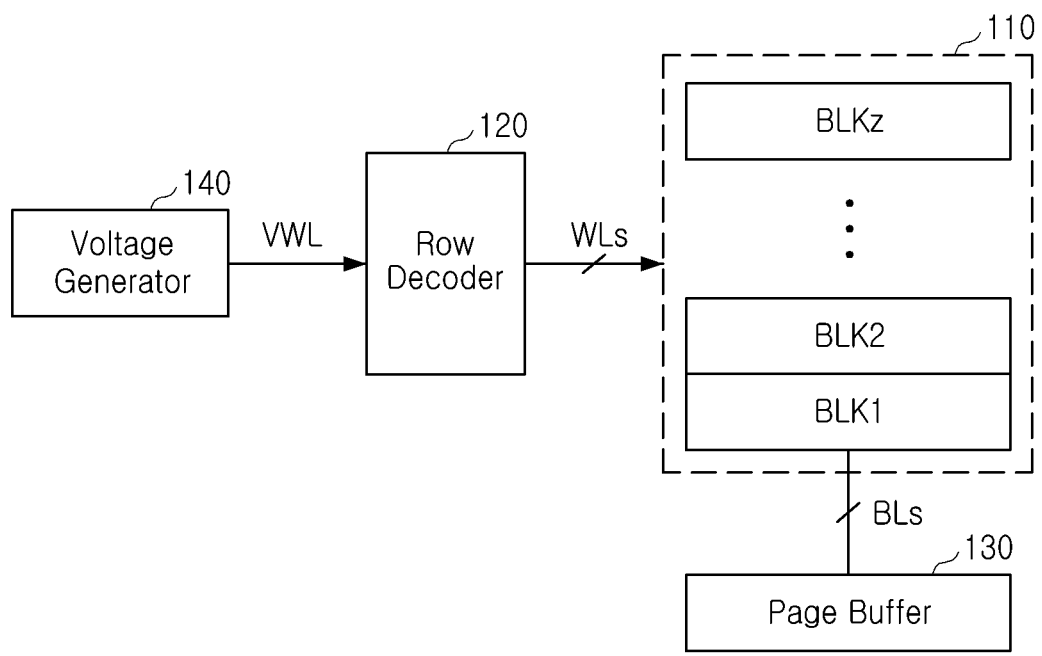
FIG. 2B is a diagram illustrating each plane by way of example.

FIG. 2A is a diagram illustrating a plurality of planes 101, . . . 10K-1, 10K according to an example embodiment, and FIG. 2B is a diagram illustrating each plane according to an example embodiment.

Referring to FIG. 2A, each plane may include a plurality of memory blocks BLK1 to BLKz, (where z is an integer equal to or greater than 2).

Referring to FIG. 2B, each plane may include a memory cell array 110, a row decoder 120, and a page buffer circuit 130.

The memory cell array 110 may be connected to the row decoder 120 through word lines WLs or selection lines SSL and GSL. The memory cell array 110 may be connected to the page buffer circuit 130 through bit lines BLs. The memory cell array 110 may include a plurality of cell strings. Each channel of the cell strings may be formed in a vertical or horizontal direction. Each of the cell strings may include a plurality of memory cells. Here, the plurality of memory cells may be written, erased, or read by a voltage applied to the bit line BLs or the word line WLs. In general, a write operation is performed in units of pages, and an erase operation is performed in units of blocks. Details of memory cells are described in U.S. Pat. Nos. 7,679,133, 8,553,466, 8,654,587, 8,559,235, and 9,536,970, which are incorporated herein by reference. In an example embodiment, the memory cell array 330 may include a two-dimensional (2D) memory cell array, and the 2D memory cell array may include a plurality of NAND strings disposed in a row direction and a column direction.

The row decoder 120 may be implemented to select one of the memory blocks BLK1 to BLKz of the memory cell array 110 in response to an address ADD. The row decoder 120 may select one of the word lines of the selected memory block in response to the address ADD. The row decoder 120 may transfer a word line voltage VWL corresponding to an operation mode to the word line of the selected memory block. During a write operation, the row decoder 120 may apply a write voltage and a verify voltage to the selected word line, and may apply a pass voltage to an unselected word line. During a read operation, the row decoder 120 may apply a read voltage to the selected word line and may apply a read pass voltage to an unselected word line.

The page buffer circuit 130 may be implemented to operate as a write driver or a sense amplifier. During a write operation, the page buffer circuit 130 may apply a bit line voltage corresponding to data to be written to the bit lines of the memory cell array 110. During a read operation or a verify read operation, the page buffer circuit 130 may sense data stored in the selected memory cell through the bit line BL. Each of the plurality of page buffers included in the page buffer circuit 130 may be connected to at least one bit line.

Meanwhile, the nonvolatile memory device 100 may further include an input/output circuit. According to an example embodiment, the input/output circuit may include components for facilitating input of signals or data and components for facilitating output of signals or data. The input/output circuit may provide externally provided data to the page buffer circuit 130. The input/output circuit may provide the externally provided command CMD to the control logic 150 (refer to FIG. 1). The input/output circuit may provide the externally provided address ADD to the control logic 150 or the row decoder 120. In addition, the input/output buffer circuit may output data sensed and latched by the page buffer circuit 130 to the outside.

Meanwhile, the nonvolatile memory device 100 may further include a voltage generator 140 according to an example embodiment. The voltage generator 140 may be implemented to generate various types of word line voltages to be applied to respective word lines and well voltages to be supplied to a bulk (e.g., well region) in which memory cells are formed under the control of the control logic 150. The word line voltages applied to each word line may include a write voltage, a pass voltage, a read voltage, and read pass voltages. In an example embodiment, the voltage generator 140 may be provided for each plane. However, the disclosure is not limited thereto, and as such, according to another example embodiment, the planes 101, . . . , 10K may share the voltage generator 140. According to yet another example embodiment, the voltage generator 140 may be omitted from each of the planes 101, . . . , 10K. In such, a case the voltage generator 140 may be provided outside of the planes 101, . . . , 10K according to an example embodiment.

Figure 3:
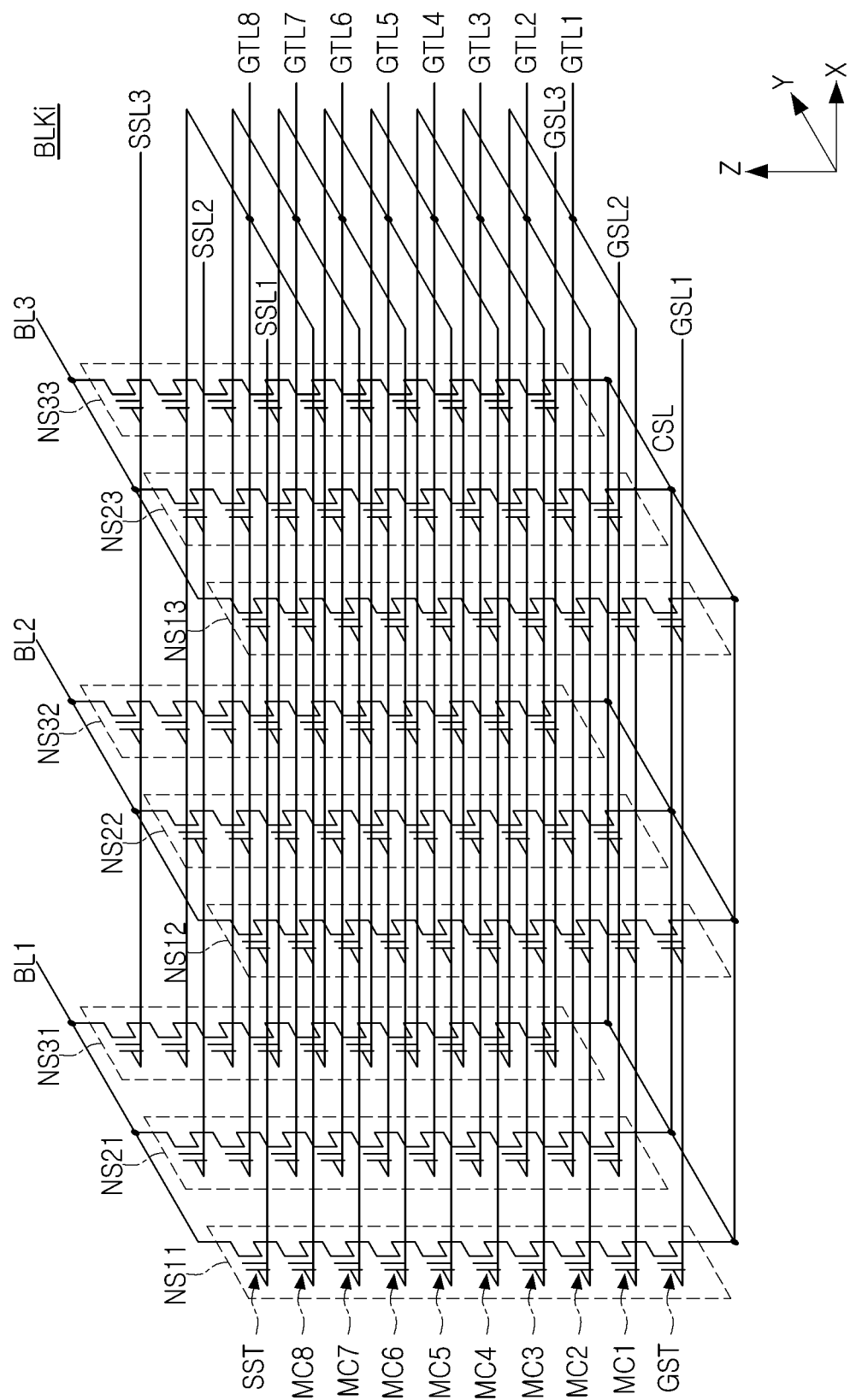
FIG. 3 is a circuit diagram of a memory block according to an example embodiment of the disclosure.

FIG. 3 is a circuit diagram of a memory block (BLKi), (where i is an integer greater than or equal to 2) according to an example embodiment of the disclosure. A plurality of memory NAND strings included in the memory block BLKi may be formed in a direction perpendicular to the substrate.

Referring to FIG. 3, the memory block BLKi may include a plurality of memory NAND strings NS11 to NS33 connected between the bit lines BL1, BL2, and BL3 and the common source line CSL. Each of the plurality of memory NAND strings NS11 to NS33 may include a string select transistor SST, a plurality of memory cells MC1, MC2, MC3, MC4, MC5, MC6, MC7 and MC8, and a ground select transistor GST. FIG. 3 illustrates that each of the plurality of memory NAND strings NS11 to NS33 includes eight memory cells MC1, MC2, MC3, MC4, MC5, MC6, MC7 and MC8, but the disclosure is not limited thereto.

The string select transistor SST may be connected to the corresponding string selection lines SSL1, SSL2, and SSL3. The plurality of memory cells MC1, MC2, . . . , MC8 may be respectively connected to corresponding gate lines GTL1, GTL2, GTL3, GTL4, GTL5, GTL6, GTL7, and GTL8. The gate lines GTL1, GTL2, GTL3, GTL4, GTL5, GTL6, GTL7, and GTL8 may correspond to word lines, and some of the gate lines GTL1, GTL2 GTL3, GTL4, GTL5, GTL6, GTL7, and GTL8 may correspond to dummy word lines. The ground select transistor GST may be connected to the corresponding ground selection lines GSL1, GSL2, and GSL3. The string select transistor SST may be connected to the corresponding bit lines BL1, BL2, and BL3, and the ground select transistor GST may be connected to the common source line CSL.

Word lines of the same height (e.g., WL1) may be connected in common, and the ground selection lines GSL1, GSL2, and GSL3 and the string selection lines SSL1, SSL2, and SSL3 may be separated from each other. FIG. 3 shows that the memory block BLK is connected to eight gate lines GTL1, GTL2, GTL3, GTL4, GTL5, GTL6, GTL7, and GTL8 and three bit lines BL1, BL2, and BL3, but is not necessarily limited thereto.

Figure 4:
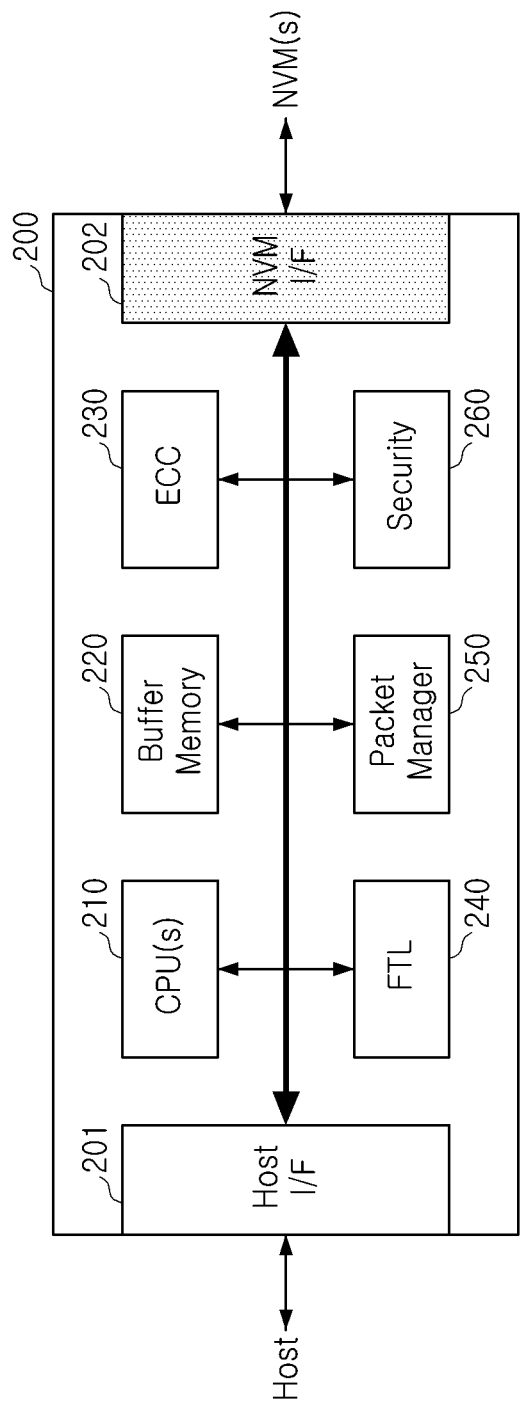
FIG. 4 is a diagram illustrating a controller according to an example embodiment of the disclosure.

FIG. 4 is a diagram illustrating the controller 200 according to an example embodiment of the disclosure. Referring to FIG. 4, the controller 200 may include a host interface (I/F) circuit 201, a nonvolatile memory interface circuit (NVM I/F) 202, at least one processor (CPU(s)) 210, a buffer memory 220, an error correction circuit (ECC) 230, a flash translation layer (FTL) manager 240, a packet manager 250, and an encryption device (security) 260. According to an example embodiment, one or more components of the controller 200 may be implemented by a hardware component or a circuit. For example, such as the FTL manger 240, packet manager 250 and the encryption device 260.

The host I/F circuit 201 may be implemented to transmit and receive packets to and from a host. A packet transmitted from the host to the host I/F circuit 201 may include a command or data to be written to the nonvolatile memory 100. A packet transmitted from the host I/F circuit 201 to the host may include a response with respect to a command or data read from the nonvolatile memory 100.

The memory interface circuit 202 may transmit data to be written to the nonvolatile memory 100 to the nonvolatile memory 100 or receive data read from the nonvolatile memory 100. The memory interface circuit 202 may be implemented to comply with a standard protocol such as JEDEC Toggle or Open NAND Flash Interface (ONFI).

The FTL manager 240 may perform various functions such as address mapping, wear-leveling, and garbage collection. The address mapping operation is an operation of changing a logical address received from the host into a physical address used to actually store data in the nonvolatile memory 100. Wear-leveling is a technology for preventing excessive degradation of a specific block by ensuring that blocks in the nonvolatile memory 100 are used uniformly, for example, which may be implemented through a firmware technology balancing erase counts of physical blocks. Garbage collection is a technology for securing usable capacity in the nonvolatile memory 100 by copying valid data of a block to a new block and then erasing the existing block.

The packet manager 250 may generate a packet according to a protocol of an interface negotiated with the host or parse various information from a packet received from the host. Also, the buffer memory 216 may temporarily store data to be written to the nonvolatile memory 100 or data read from the nonvolatile memory 100. In an example embodiment, the buffer memory 220 may be a component provided in the controller 200. In another example embodiment, the buffer memory 220 may be disposed outside the controller 200.

The encryption device 260 may perform at least one of an encryption operation and a decryption operation on data input to the storage controller 210 using a symmetric-key algorithm. The encryption device 260 may perform encryption and decryption of data using an advanced encryption standard (AES) algorithm. The encryption device 260 may include an encryption module and a decryption module. In an example embodiment, the encryption device 260 may be implemented in hardware/software/firmware. The encryption device 260 may perform a self encryption disk (SED) function or a trusted computing group (TCG) security function. The SED function may store encrypted data in the nonvolatile memory device 100 using an encryption algorithm or may decrypt encrypted data from the nonvolatile memory device 100. The encryption/decryption operation may be performed using an internally generated encryption key. The TCG security function may provide a mechanism enabling access control to user data of the storage device 100. For example, the TCG security function may perform an authentication procedure between an external device and the storage device 100. In an example embodiment, the SED function or the TCG security function is optionally selectable.

Hereinafter, an extended status check command according to an example embodiment of the disclosure will be described.

Figure 5:
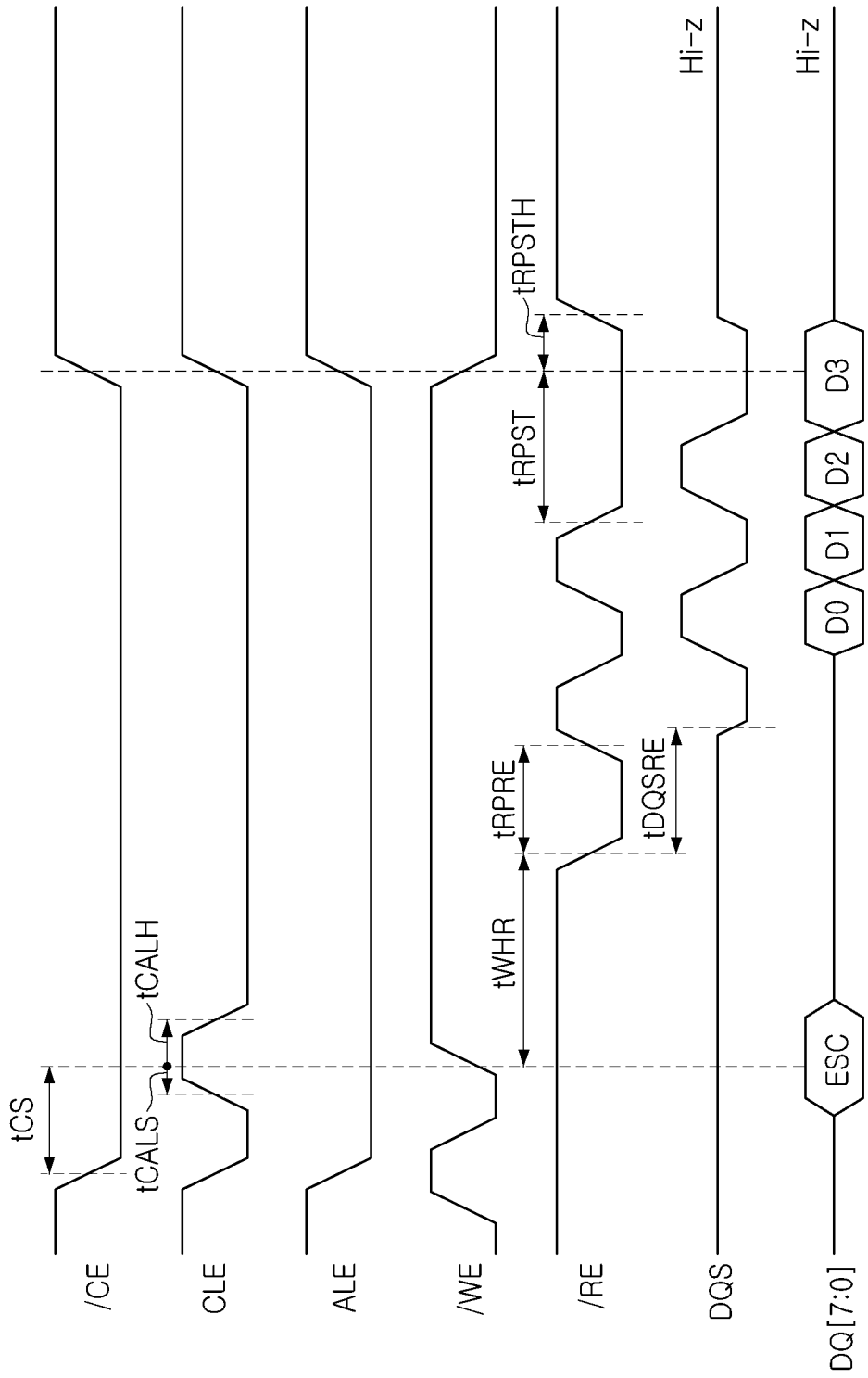
FIG. 5 is a timing diagram illustrating an extended status check command (ESC) according to an example embodiment of the disclosure.

FIG. 5 is a timing diagram for an extended status check command ESC according to an example embodiment of the disclosure.

Referring to FIG. 5, an extended status check command ESC for determining status information about the planes 101, . . . , 10K of the nonvolatile memory device 100 (refer to FIG. 1) may be transmitted to data lines DQ[7:0]). For example, the extended status check command ESC may be output through the data lines DQ[7:0] at a setup time tCS of a chip activation signal/CE. Here, the setup time tCS of the chip activation signal/CE may correspond to a setup time tCALS of the command latch activation signal CLE from a falling edge. The extended status check command ESC may be output from the setup time tCALS of the command latch activation signal CLE to a holding time tCALH.

The nonvolatile memory device 100 may receive the extended status check command ESC and output a status of each plane to the data lines DQ[7:0]) by toggling of a read activation signal /RE corresponding to the number of planes.

For example, the read activation signal /RE may be output from a point in time when a time tWHR has elapsed from a point in time when the extended status check command ECS is received. Here, time tWHR is a predetermined time.

Moreover, tWHR is a time from a command, address, or data input cycle to a data output cycle. The read activation signal /RE may be toggled after a read preamble time tRPRE. In this case, the data strobe signal DQS may be toggled to correspond to the number of planes in response to the read activation signal /RE after the access window tDQSRE. In each cycle of the data strobe signal DQS, data D0, D1, D2, and D3 may be output at a rising edge and a falling edge. Here, the data D0, D1, D2, and D3 may include corresponding plane status information. For example, in one cycle of the read activation signal /RE, the status information D0 of the first plane 101 may be output in response to a rising edge, and the status information D1 of the second plane 102 may be output in response to a falling edge. In a next cycle of the read activation signal /RE, the status information D2 of the third plane 103 and the status information D3 of the fourth plane 104 may be output in the same manner.

After the read enable signal /RE is toggled, the read enable signal has a read postamble time tRPST until the chip enable signal/CE, the command latch enable signal CLE, and the address latch enable signal ALE transition from a low level to a high level. Even if the read activation signal /RE is not toggled, the data strobe signal DQS may be toggled until the read postamble time tRPST. Thereafter, the read activation signal /RE has a read postamble holding time tRPSTH to correct a data output time. The last data D3 may be output through the data lines DQ[7:0] until the read postamble holding time tRPSTH.

In an example embodiment, the extended status check command ESC may be implemented using a reserved command. For example, the extended status check command (ESC) may be implemented using the 77h command.

Meanwhile, it should be understood that a timing of the extended status check command ESC shown in FIG. 5 is only an example embodiment. According to the method of determining a plane status of the nonvolatile memory device according to an example embodiment of the disclosure, an extended status check command (ESC) may be transmitted, the read activation signal /RE may be toggled by the number of planes of a selected die after a first time (e.g., tWHR), and the data strobe signal DQS and the data (DQ[7:0]) by the number of toggling may be returned after a second time (e.g., tDQSRE), thereby determining a plane status.

Meanwhile, FIG. 5 presents a new protocol for requesting status values of all planes in the nonvolatile memory device in one command set. The disclosure is not limited thereto. As such, according to another example embodiment of the disclosure, a protocol may include a command set for selectively requesting a status value from among the planes inside the nonvolatile memory device. For example, instead of requesting status values of all planes in the nonvolatile memory device, one status of selected planes may be requested according to another example embodiment.

Figure 6:
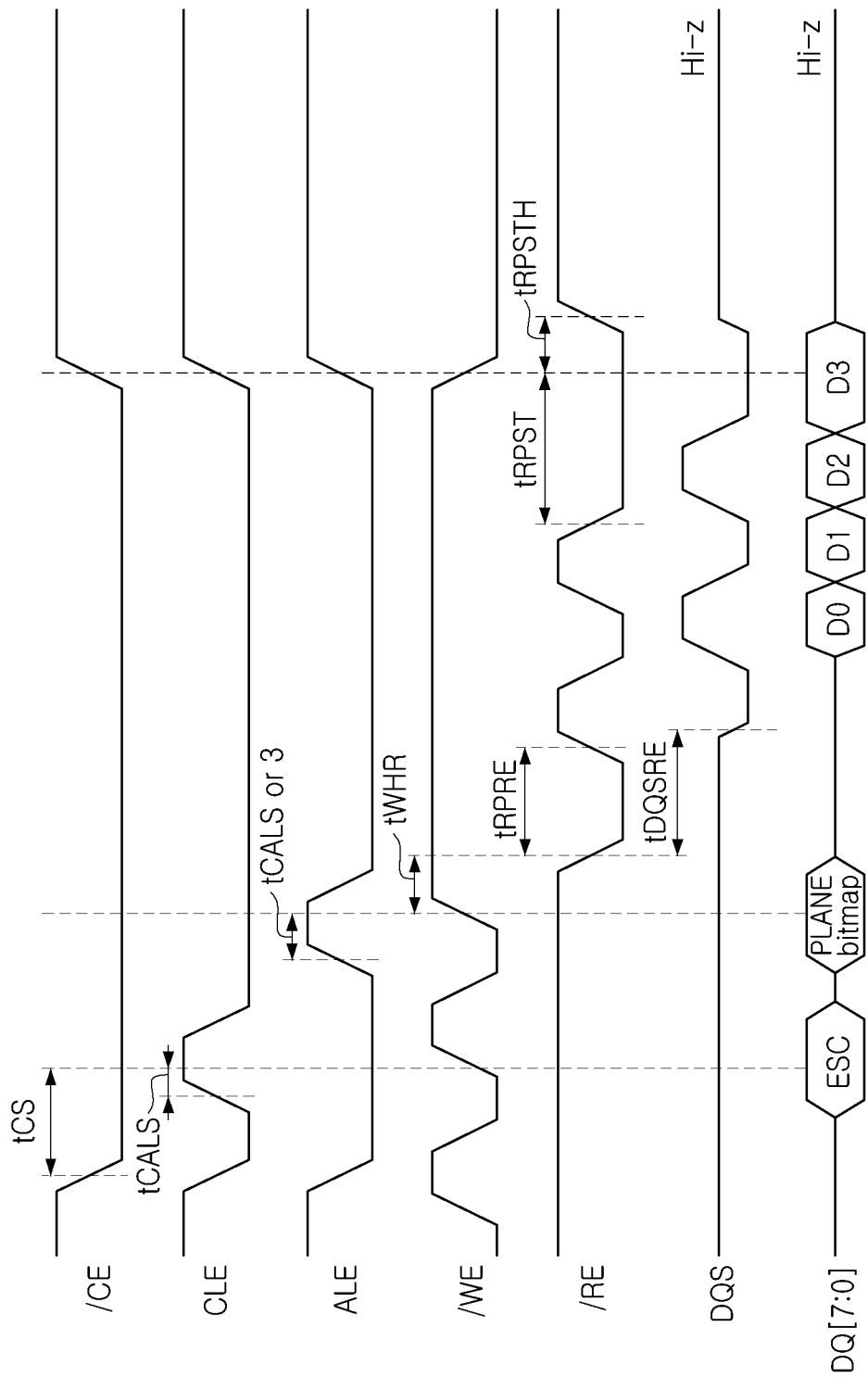
FIG. 6 is a timing diagram illustrating an extended status check command (ESC) according to another example embodiment of the disclosure.

FIG. 6 is a timing diagram for an extended status check command (ESC) according to another example embodiment of the disclosure. Referring to FIG. 6, the plane status output protocol uses an address cycle to indicate a plane requesting status information. After the extended status check command ESC is output, a plane bitmap value may be output through the data lines DQ[7:0] in response to the write enable signal/WE. The plane bitmap value may include information indicating a plane for which status information is desired among planes of the nonvolatile memory device. The plane bitmap value may be received after a setup time (tCALS or 3 (ps)) of an address latch activation signal ALE.

In an example embodiment, the extended status check command ESC may be implemented using a reserved command. For example, the extended status check command (ESC) may be implemented using a 78h command.

In the method of determining a plane status according to an example embodiment of the disclosure, a plane bitmap value may be transmitted in an address cycle (or phase) within one command set, and a state among planes of a nonvolatile memory device may be selectively checked.

According to the method of determining a plane status of a nonvolatile memory device according to an example embodiment of the disclosure, an extended status check command (ESC) may be transmitted, bitmap information of a plane selected in an address transfer cycle is transmitted, a read activation signal /RE is toggled by as much as plane information to be read after a first time (e.g., tWHR), and the data strobe signal DQS as much as toggling and the data (DQ[7:0]) having selected plane status information may be returned, thereby determining a plane status.

In an example embodiment, plane numbers may be allocated to LSB (Least Significant Bit) of the plane bitmap in the order of the plane number. If the nonvolatile memory device is a dual die package (DDP), a quad die package (QDP), or an octal die package (ODP), an address cycle for transmitting the plane bitmap may be added once more.

Meanwhile, the storage device according to an example embodiment of the disclosure may perform a process of determining plane information of the nonvolatile memory device.

Figure 7A:
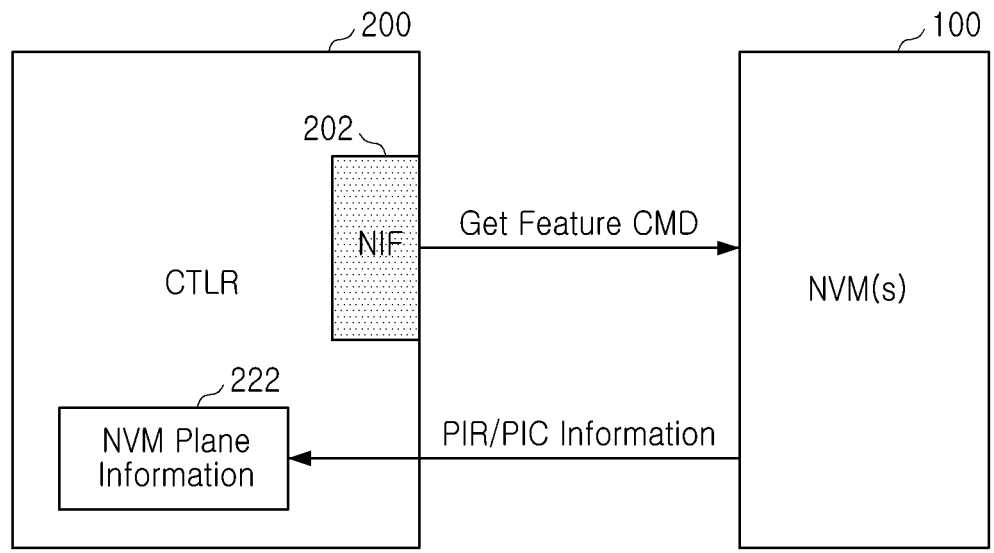
FIGS. 7A and 7B are diagrams illustrating a process of determining plane information of a nonvolatile memory device according to an example embodiment of the disclosure.
Figure 7B:
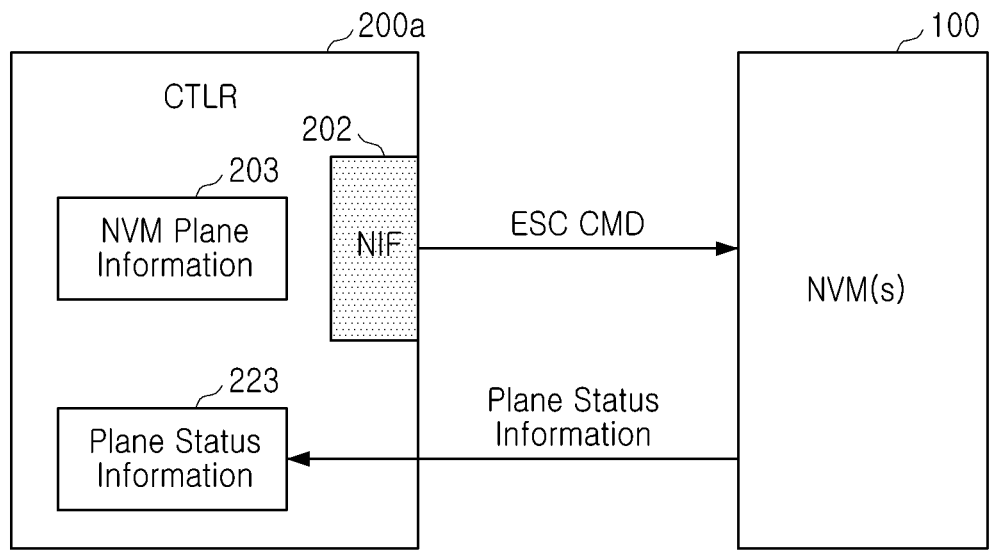

FIGS. 7A and 7B are diagrams illustrating a process of determining plane information of a nonvolatile memory device according to an example embodiment of the disclosure.

Referring to FIG. 7A, the nonvolatile memory interface circuit NIF 202 of the controller 200 may output a get feature command (CMD) to the nonvolatile memory device 100 to determine PIR/PIC (plane independent read/plane independent command) support information of the nonvolatile memory device 100. The nonvolatile memory device 100 may output PIR/PIC information in response to a get feature command. The controller 200 may obtain and store plane information of the nonvolatile memory device 100 by using the PIR/PIC information. The plane information of the nonvolatile memory device 100 may be stored in the volatile memory 222 of the controller 200. The nonvolatile memory interface circuit NIF may issue an extended status check command ESC for determining a status of each plane based on the plane information.

The storage device according to an example embodiment of the disclosure may issue a get feature command to determine a number of planes in the nonvolatile memory device before generating the extended status check command (ESC), and determine a plane supporting the plane independent command (PIC) implemented in the nonvolatile memory device. After determining the plane information once, when there is no power cycle, the corresponding information in the controller may be maintained.

Also, as shown in FIG. 7B, the storage device may store the plane information of the nonvolatile memory device in a nonvolatile memory or a fuse 203 inside a controller 200a. The nonvolatile memory interface circuit NIF may issue an extended status check command ESC to determine each plane status information using the plane information stored in the controller 200a. The nonvolatile memory device 100 may output each plane status information in response to the extended status check command ESC. The controller 200a may receive the plane status information from the nonvolatile memory device 100 and store the plane status information in a memory device 223. Here, the memory device 223 may include a first input first out (FIFO) memory.

The storage device according to an example embodiment of the disclosure stores the number of planes of the nonvolatile memory device 100 connected to the controller 200*a* in an internal nonvolatile memory (e.g., ROM) or an E-FUSE of the controller 200*a* before issuing the extended status check command ESC, thereby determining toggling of the read activation signal /RE corresponding to the number of planes immediately, without performing a separate plane information determining process.

Figure 8A:
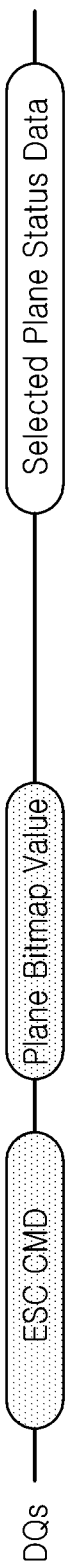

FIGS. 8A and 8B are diagrams illustrating a selective plane status determine method using a plane bitmap value according to an example embodiment of the disclosure.

As shown in FIG. 8A, after the extended status check command ECS is output through the data lines DQ, a plane bit map value may be output at an address transmission timing. Thereafter, after a predetermined time, plane status data for the selected plane may be output through the data lines DQ.

As shown in FIG. 8B, a first DQ value (DQ[0]) indicates a first plane, a second DQ value (DQ[1]) indicates a second plane, a third DQ value (DQ)[2]) indicates a third plane, a fourth DQ value (DQ[3]) indicates a fourth plane, a fifth DQ value (DQ[4]) indicates a fifth plane, and a sixth DQ value (DQ[5]) indicates a sixth plane, a 7th DQ value (DQ[6]) indicates a seventh plane, and an 8th DQ value (DQ[7]) indicates an eighth plane. Meanwhile, it should be understood that the relationship between the DQ values and the planes of the disclosure is not limited thereto.

Meanwhile, when the nonvolatile memory device is a dual die package (DDP), a quad die package (QDP), or an octal die package (ODP), the nonvolatile memory device may include eight or more planes. In this case, an address cycle for transmitting the plane bitmap may be added several times.

Figure 9A:

FIGS. 9A and 9B are diagrams illustrating a method of selectively determining a plane status using a plane bitmap value according to another example embodiment of the disclosure.

Referring to FIG. 9A, after the extended status check command ECS is output through the data lines DQ, a plurality of plane bitmap values (ADD 1 to ADD j), (where j is an integer greater than or equal to 2) may be output at an address transmission timing. Thereafter, after a predetermined time, plane status data for a selected plane may be output through the data lines DQ.

Referring to FIG. 9B, a first plane bit map value ADD 1 indicates first to eighth planes (Plane 1~Plane 8), a second plane bit map value ADD 2 indicates ninth to sixteenth planes (Plane 9~Plane 16), and a third plane bit map value ADD 3 indicates 17th to 24th planes (Plane 17~Plane 24), and a fourth plane bit map value ADD 4 indicates the 25th to the 32nd planes (Plane 25~Plane 32).

Meanwhile, it should be understood that the relationship between the plane bitmap values and the planes shown in FIG. 9B is only an example.

Meanwhile, each plane according to an example embodiment of the disclosure may output a ready and busy signal (/RnB) indicating a plane status in each.

Figure 10:
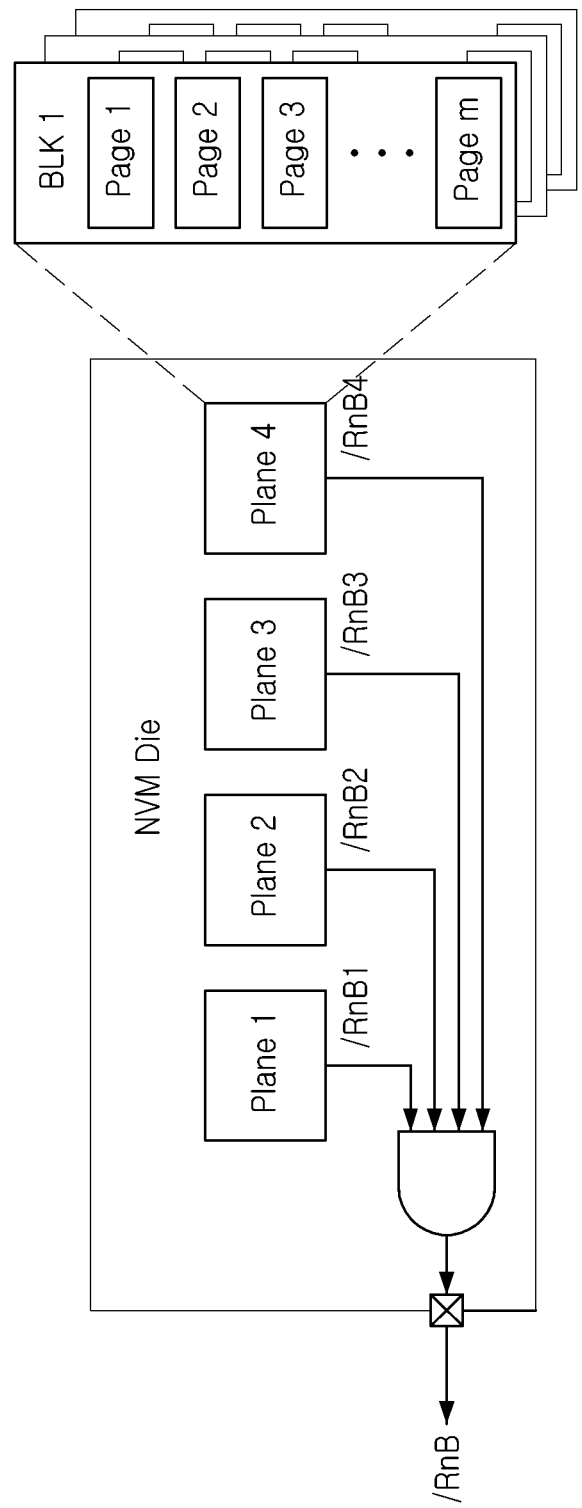
FIG. 10 is a diagram illustrating output of a ready and busy signal (/RnB) from a nonvolatile memory device (NVM Die) according to an example embodiment of the disclosure.

FIG. 10 is a diagram illustrating output of a ready and busy signal (/RnB) from a nonvolatile memory device (NVM Die) according to an example embodiment of the disclosure. Referring to FIG. 10, ready and busy signals/ RnB1,/RnB2,/RnB3 and/RnB4 may be output from four planes, respectively. A final ready and busy signal/RnB may be output according to a combination of the ready and busy signals/RnB1,/RnB2,/RnB3 and/RnB4 by a logic circuit.

Meanwhile, since the nonvolatile memory device (NVM Die) according to an example embodiment of the disclosure outputs plane status information through the data lines DQ, the final ready and busy signal/RnB in a floating state may also be output.

Figure 11:
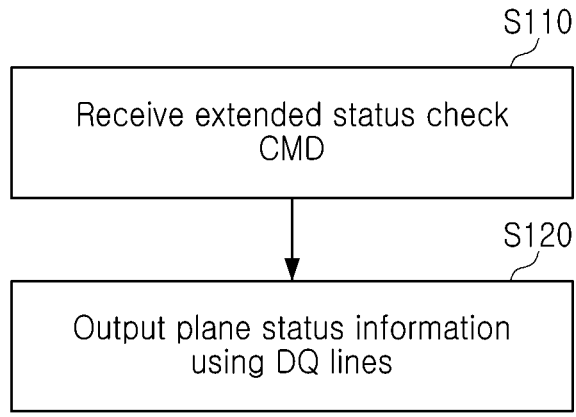
FIG. 11 is a flowchart illustrating an operating method of a nonvolatile memory device according to an example embodiment of the disclosure.

FIG. 11 is a flowchart illustrating a method of operating the nonvolatile memory device 100 according to an example embodiment of the disclosure. Referring to FIGS. 1 to 11, the nonvolatile memory device 100 may operate as follows.

According to an example embodiment, the nonvolatile memory device 100 may receive the extended status check command ESC from the external controller 200 (refer to FIG. 1). Here, the extended status check command ESC may be a command for requesting a status of internal planes of the nonvolatile memory device 100. The nonvolatile memory device 100 may output each plane status information to the controller 200 through the data lines DQ based on the extended status check command ECS (S120). The nonvolatile memory device 100 may output each plane status information to the controller 200 through the data lines DQ in response to the extended status check command ECS.

Figure 12:
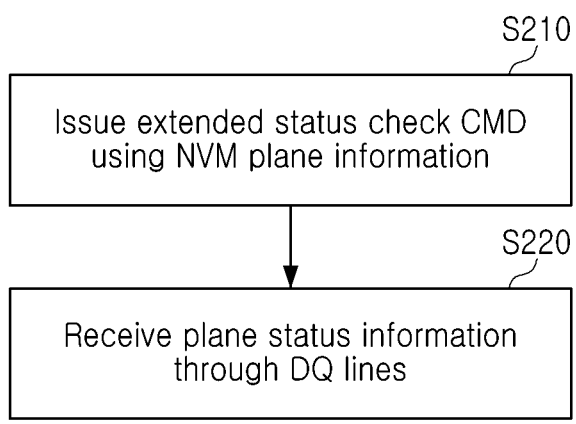
FIG. 12 is a flowchart illustrating an operating method of a controller according to an example embodiment of the disclosure.

FIG. 12 is a flowchart illustrating an operating method of a controller according to an example embodiment of the disclosure. Referring to FIGS. 1 to 12, the controller 200 may operate as follows.

The controller 200 may issue an extended status check command ESC by using the plane information of the nonvolatile memory device 100 (S210). Here, the plane information may be previously stored in the controller 200 or may be information obtained from the nonvolatile memory device 100. The controller 200 may receive plane status information corresponding to the extended status check command ECS through the data lines DQ (S220).

Figure 13:
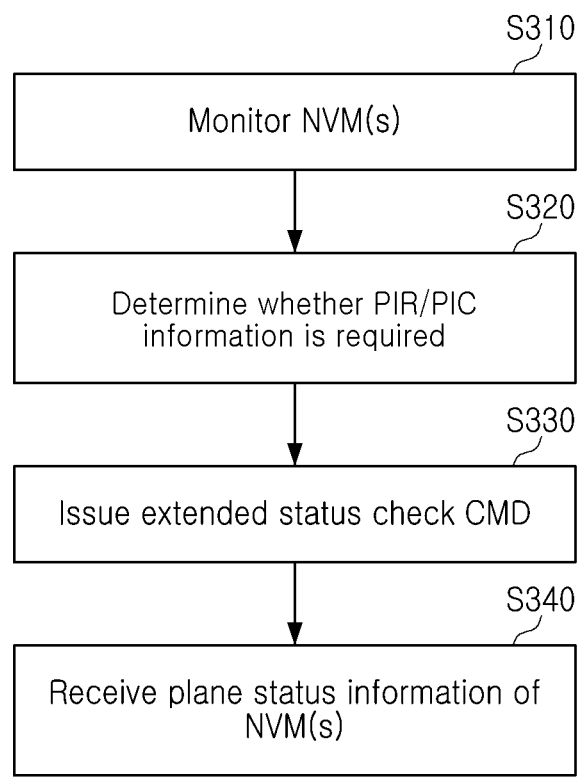
FIG. 13 is a flowchart illustrating an operating method of a controller according to another example embodiment of the disclosure.

FIG. 13 is a flowchart illustrating an operating method of the controller 200 according to another example embodiment of the disclosure. Referring to FIGS. 1 to 13, the controller 200 may operate as follows.

The controller 200 may monitor an operation of at least one nonvolatile memory device 100 (S310). The controller 200 may determine whether PIR/PIC information of the nonvolatile memory device 100 is required. According to an example embodiment, the controller 200 may determine that a PIR/PIC information of the nonvolatile memory device 100 is required when a predetermined condition is satisfied or met according to a monitoring result (S320). If PIR/PIC information is required, the controller 200 may generate an extended status check command ESC (S330). The controller 200 may receive each plane status information about the nonvolatile memory device 100 corresponding to the extended status check command ESC (S340).

Figure 14:
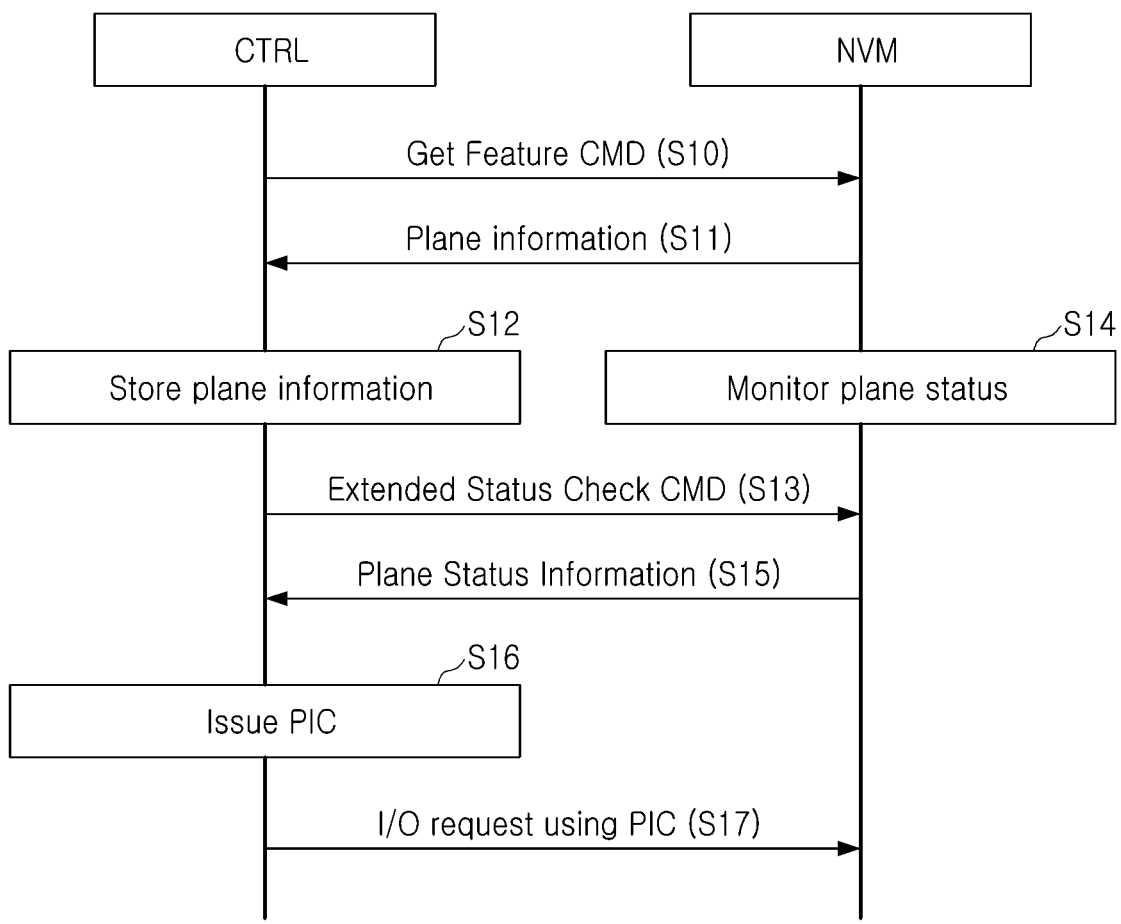
FIG. 14 is a ladder diagram illustrating an operating method of a storage device according to an example embodiment of the disclosure.

FIG. 14 is a ladder diagram illustrating an operating method of the storage device 10 according to an example embodiment of the disclosure. Referring to FIG. 14, the storage device 10 may operate as follows.

The controller CTRL may transmit a get feature command to the nonvolatile memory device NVM to obtain plane information (S10). The nonvolatile memory device NVM may output plane information to the controller CTRL in response to the get feature command (S11).

Until the nonvolatile memory device NVM is disconnected or the power supply is cut off, the controller CTRL may store the received plane information in the volatile memory device (S12). Thereafter, the controller CTRL may output the extended status check command ESC to the nonvolatile memory device NVM by using the plane information (S13). The nonvolatile memory device NVM may monitor each plane status in real time (S14), and may output each plane status information to the controller CTRL in response to the extended status check command ESC (S15). In an example embodiment, the plane status information may be transmitted through a data channel (e.g., data lines DQ). In another example embodiment, the plane status information may be transmitted through a side channel (e.g., I2C, SPI, etc.).

The controller CTRL may store the received plane status information in the volatile memory device. The controller CTRL may output an input/output request using the PIC command to the nonvolatile memory device NVM by using the plane status information (S17).

Meanwhile, the storage device according to an example embodiment of the disclosure may include a dedicated artificial intelligence processor for determining the plane status.

Figure 15:
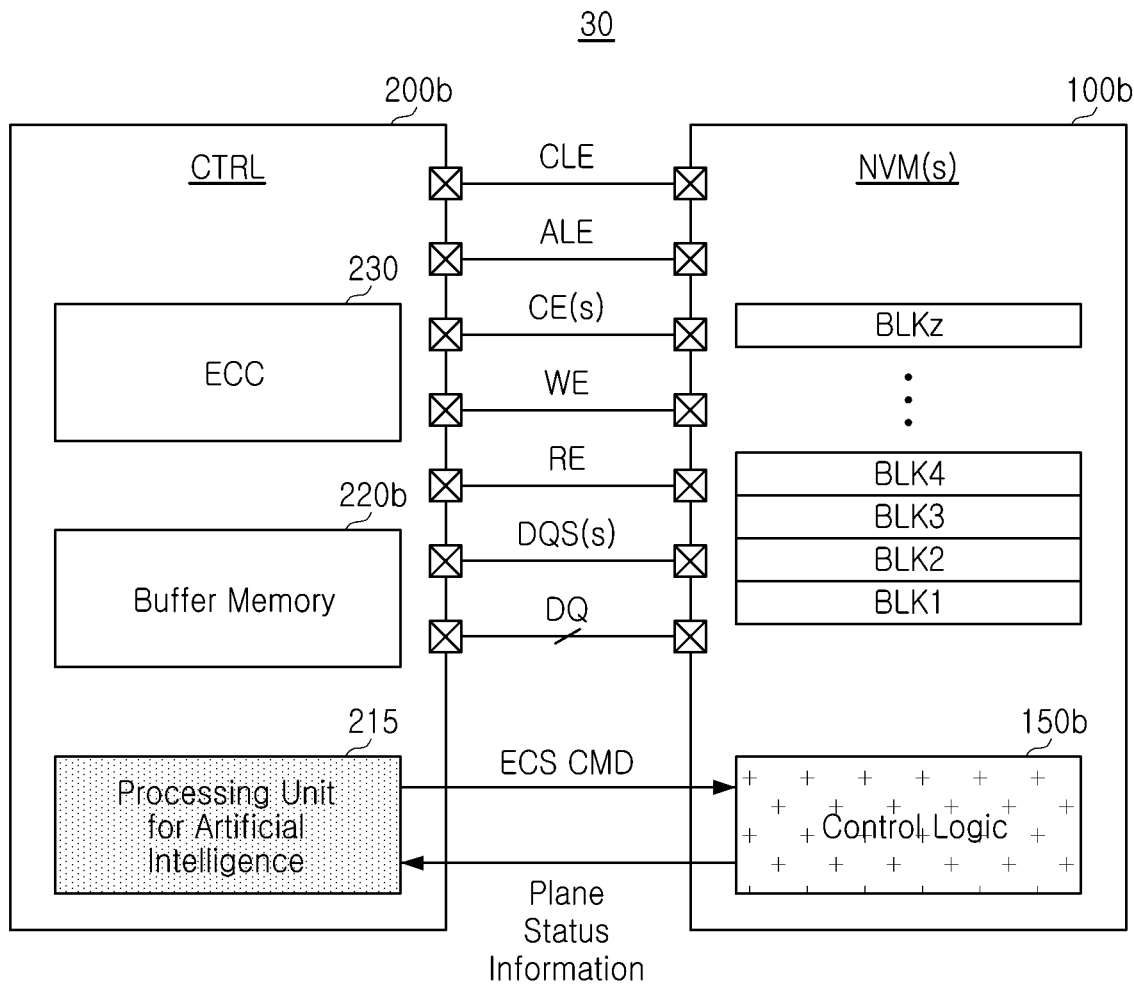
FIG. 15 is a diagram illustrating a storage device according to another example embodiment of the disclosure.

FIG. 15 is a diagram illustrating a storage device 30 according to another example embodiment of the disclosure. Referring to FIG. 15, the controller 200*b* of the storage device 30 may include an artificial intelligence processor (i.e., a processing unit for artificial intelligence) 215 determining a plane status compared to that shown in FIG. 1. The artificial intelligence processor 215 may be implemented to issue an extended status check command (ESC) and receive each plane status information, as described in FIGS. 1 to 14. The nonvolatile memory device 100*b* may include a control logic 150*b* receiving the extended status check command ESC and outputting each plane status information under the control of the artificial intelligence processor 215.

Also, the controller 200*b* may include a buffer memory 220*b* and an error correction circuit (ECC) 230. The buffer memory 220*b* may be implemented as a volatile memory (e.g., static random access memory (SRAM), dynamic RAM (DRAM), synchronous RAM (SDRAM), etc.) or a nonvolatile memory (flash memory, phase-change RAM (PRAM), Magneto-resistive RAM (MRAM), resistive RAM (Re-RAM), ferro-electric RAM (FRAM), etc.).

The ECC circuit 230 may be implemented to generate an error correction code during a write operation and recover data DATA by using the error correction code during a read operation. That is, the ECC circuit 230 may generate an error correction code (ECC) for correcting a fail bit or an error bit of the data DATA received from the nonvolatile memory device 100. The ECC circuit 230 may form data DATA to which a parity bit is added by performing error correction encoding of data provided to the nonvolatile memory device 100. The parity bit may be stored in the nonvolatile memory device 100.

Also, the ECC circuit 230 may perform error correction decoding on the data DATA output from the nonvolatile memory device 100. The ECC circuit 230 may correct an error using parity. ECC circuit 230 may correct an error using coded modulation such as a low density parity determine (LDPC) code, BCH code, turbo code, Reed-Solomon code, convolution code, recursive systematic code (RSC), trellis-coded modulation (TCM), block coded modulation (BCM). Meanwhile, when error correction is impossible in the error correction circuit 230, a read retry operation may be performed.

Meanwhile, the nonvolatile memory device according to an example embodiment of the disclosure may be implemented in a chip to chip (C2C) structure.

Figure 16:
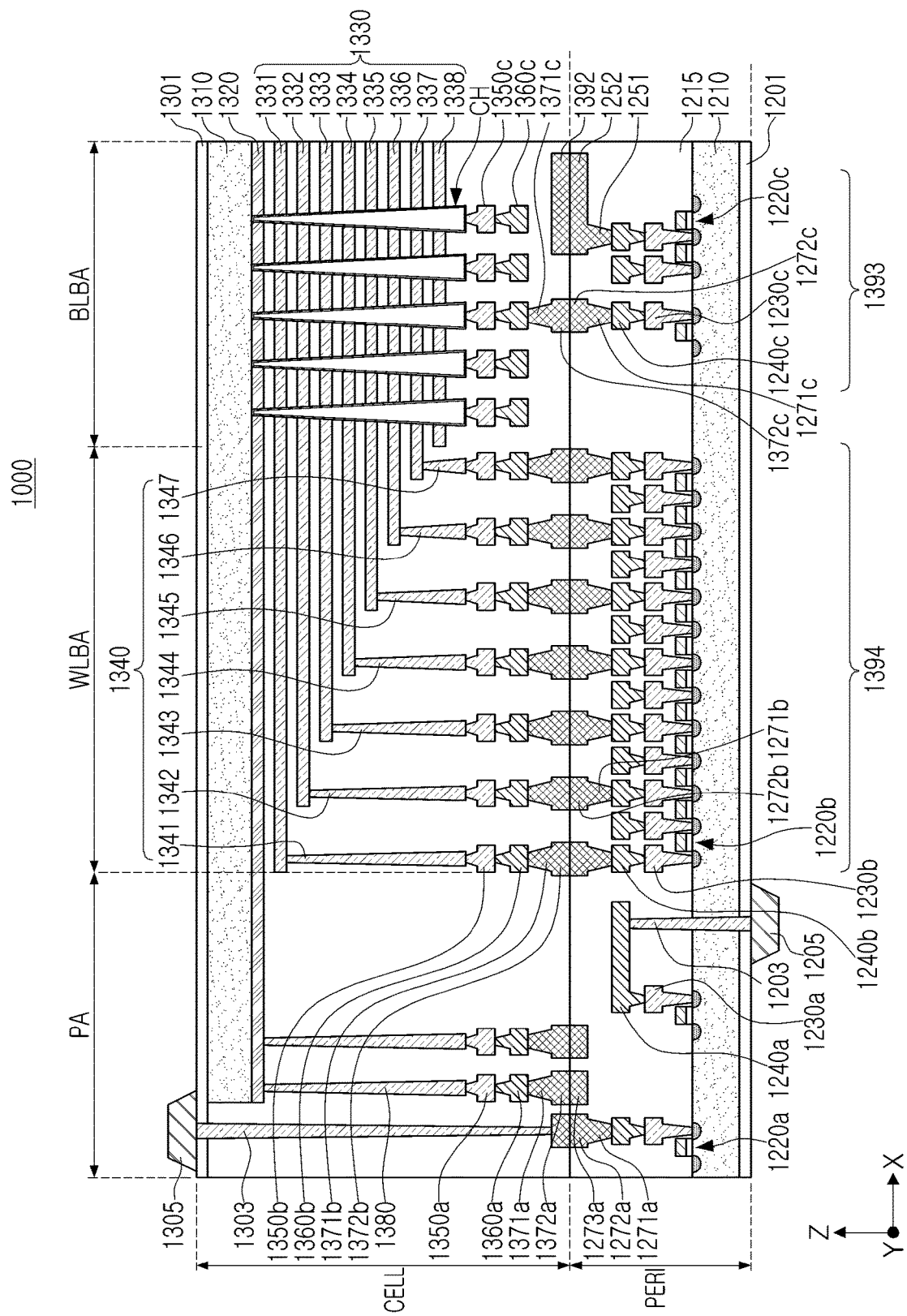
FIG. 16 is a diagram illustrating a nonvolatile memory device implemented in a C2C structure according to an example embodiment of the disclosure.

FIG. 16 is a diagram illustrating a nonvolatile memory device 1000 implemented in a C2C structure according to an example embodiment of the disclosure. In the C2C structure, an upper chip including a cell region CELL is fabricated on a first wafer, a lower chip including a peripheral circuit region PERI is fabricated on a second wafer different from the first wafer, and the upper chip and the lower chip may be connected to each other by a bonding method. For example, the bonding method may be a method of electrically connecting a bonding metal formed at the uppermost metal layer of the upper chip and a bonding metal formed at the uppermost metal layer of the lower chip to each other. In an example embodiment, when the bonding metal is formed of copper (Cu), the bonding method may be a Cu-to-Cu bonding method. In another example embodiment, the bonding metal may be formed of aluminum (Al) or tungsten (W).

Each of the peripheral circuit region PERI and the cell region CELL of the nonvolatile memory device 1000 may include an external pad bonding region PA, a word line bonding region WLBA, and a bit line bonding region BLBA.

The peripheral circuit region PERI may include a first substrate 1210, an interlayer insulating layer 1215, a plurality of circuit elements 1220*a*, 1220*b*, and 1220*c* formed on the first substrate 1210, first metal layers 1230*a*, 1230*b*, and 1230*c* respectively connected to the plurality of circuit elements 1220*a*, 1220*b*, and 1220*c*, and second metal layers 1240*a*, 1240*b*, and 1240*c* respectively formed on the first metal layers 1230*a*, 1230*b*, and 1230*c*. In an example embodiment, the first metal layers 1230*a*, 1230*b*, and 1230*c* may be formed of tungsten having a relatively high resistivity. In an example embodiment, the second metal layers 1240*a*, 1240*b*, and 1240*c* may be formed of copper having a relatively low resistivity.

As shown in FIG. 16, the first metal layers 1230*a*, 1230*b*, and 1230*c* and the second metal layers 1240*a*, 1240*b*, and 1240*c* are illustrated, but the disclosure is not limited thereto. At least one metal layer may be further formed on the second metal layers 1240*a*, 1240*b*, and 1240*c*. At least a portion of the one or more metal layers formed on the second metal layers 1240*a*, 1240*b*, and 1240*c* may be formed of aluminum having a specific resistance different from that of copper forming the second metal layers 1240*a*, 1240*b*, and 1240*c*.

In an example embodiment, the interlayer insulating layer 1215 may be disposed on the first substrate 1210 to cover the plurality of circuit elements 1220*a*, 1220*b*, and 1220*c*, the first metal layers 1230*a*, 1230*b*, and 1230*c*, and the second metal layers 1240*a*, 1240*b*, and 1240*c*. In an example embodiment, the interlayer insulating layer 1215 may include an insulating material such as silicon oxide or silicon nitride.

Lower bonding metals 1271*b* and 1272*b* may be formed on the second metal layer 1240*b* of the word line bonding region WLBA. In the word line bonding region WLBA, the lower bonding metals 1271*b* and 1272*b* of the peripheral circuit region PERI may be electrically connected to the upper bonding metals 1371*b* and 1372*b* of the cell region CELL by a bonding method. In an example embodiment, the lower bonding metals 1271*b* and 1272*b* and the upper bonding metals 1371*b* and 1372*b* may be formed of aluminum, copper, tungsten, or the like. Additionally, the upper bonding metals 1371*b* and 1372*b* of the cell region CELL may be referred to as first metal pads, and the lower bonding metals 1271*b* and 1272*b* may be referred to as second metal pads.

The cell region CELL may include at least one memory block. In an example embodiment, the cell region CELL may include a second substrate 1310 and a common source line 1320. A plurality of word lines 1331 to 1338 (1330) may be stacked on the second substrate 1310 in a direction (Z-axis direction) perpendicular to an upper surface of the second substrate 1310. In an example embodiment, string selection lines and ground selection lines may be disposed above and below the word lines 1330, respectively. In an example embodiment, a plurality of word lines 1330 may be disposed between the string selection lines and the ground selection line.

In the bit line bonding region BLBA, a channel structure CH may extend in a direction (a Z-axis direction) perpendicular to the upper surface of the second substrate 1310 to pass through the word lines 1330, the string selection lines, and the ground selection lines. The channel structure CH may include a data storage layer, a channel layer, and a buried insulating layer, and the channel layer may be electrically connected to the first metal layer 1350*c* and the second metal layer 1360*c*. For example, the first metal layer 1350*c* may be a bit line contact, and the second metal layer 1360*c* may be a bit line. In an example embodiment, the bit line 1360*c* may extend in a first direction (a Y-axis direction) parallel to the upper surface of the second substrate 1310.

As shown in FIG. 16, a region in which the channel structure CH and the bit line 1360*c* are disposed may be defined as the bit line bonding region BLBA. In an example embodiment, the bit line 1360*c* may be electrically connected to the circuit elements 1220*c* providing the page buffer 1393 in the peripheral circuit region PERI in the bit line bonding region BLBA. For example, the bit line 1360*c* may be connected to the upper bonding metals 1371*c* and 1372*c* in the peripheral circuit region PERI. Here, the upper bonding metals 1371*c* and 1372*c* may be connected to the lower bonding metals 1271*c* and 1272*c* connected to the circuit elements 1220*c* of the page buffer 1393. In the word line bonding region WLBA, the word lines 1330 may extend in a second direction (an X-axis direction) perpendicular to the first direction and parallel to the upper surface of the second substrate 1310. In an example embodiment, the word line bonding region WLBA may be connected to the plurality of cell contact plugs 1341 to 1347 (1340). For example, the word lines 1330 and the cell contact plugs 1340 may be connected to each other in pads provided as at least some of the word lines 1330 extend in different lengths. In an example embodiment, a first metal layer 1350*b* and a second metal layer 1360*b* may be sequentially connected to an upper portion of the cell contact plugs 1340 connected to the word lines 1330. In an example embodiment, the cell contact plugs 1340 may be connected to the peripheral circuit region PERI through the upper bonding metals 1371*b* and 1372*b* of the cell region CELL in the word line bonding region WLBA and the lower bonding metals 1271*b* and 1272*b* of the peripheral circuit region PERI.

In an example embodiment, the cell contact plugs 1340 may be electrically connected to the circuit elements 1220*b* providing the row decoder 1394 in the peripheral circuit region PERI. In an example embodiment, an operating voltage of the circuit elements 1220*b* providing the row decoder 1394 may be different from an operating voltage of the circuit elements 1220*c* providing the page buffer 1393. For example, the operating voltage of the circuit elements 1220*c* providing the page buffer 1393 may be greater than the operating voltage of the circuit elements 1220*b* providing the row decoder 1394.

A common source line contact plug 1380 may be disposed in the external pad bonding region PA. In an example embodiment, the common source line contact plug 1380 may be formed of a conductive material such as a metal, a metal compound, or polysilicon. The common source line contact plug 1380 may be electrically connected to the common source line 1320. A first metal layer 1350*a* and a second metal layer 1360*a* may be sequentially stacked on the common source line contact plug 1380. For example, a region in which the common source line contact plug 1380, the first metal layer 1350*a*, and the second metal layer 1360*a* are disposed may be defined as the external pad bonding region PA. The second metal layer 1360*a* may be electrically connected to an upper metal via 1371*a*. The upper metal via 1371*a* may be electrically connected to an upper metal pattern 1372*a*.

Meanwhile, input/output pads 1205 and 1305 may be disposed in the external pad bonding region PA. Referring to FIG. 16, a lower insulating layer 1201 covering a lower surface of the first substrate 1210 may be formed below the first substrate 1210. Also, a first input/output pad 1205 may be formed on the lower insulating layer 1201. In an example embodiment, the first input/output pad 1205 may be connected to at least one of the plurality of circuit elements 1220*a*, 1220*b*, and 1220*c* disposed in the peripheral circuit region PERI through the first input/output contact plug 1203. In an example embodiment, the first input/output pad 1205 may be separated from the first substrate 1210 by the lower insulating layer 1201. Also, a side insulating layer may be disposed between the first input/output contact plug 1203 and the first substrate 1210 to electrically separate the first input/output contact plug 1203 from the first substrate 1210.

Referring to FIG. 16, an upper insulating layer 1301 covering an upper surface of the second substrate 1310 may be formed on the second substrate 1310. Also, a second input/output pad 1305 may be disposed on the upper insulating layer 1301. In an example embodiment, the second input/output pad 1305 may be connected to at least one of the plurality of circuit elements 1220*a*, 1220*b*, and 1220*c* disposed in the peripheral circuit region PERI through a second input/output contact plug 1303, a lower metal pattern 1272*a*, and a lower metal vias 1271*a*.

In an example embodiment, the second substrate 1310 and the common source line 1320 may not be disposed in a region in which the second input/output contact plug 1303 is disposed. Also, the second input/output pad 1305 may not overlap the word lines 1380 in the third direction (the Z-axis direction). Referring to FIG. 16, the second input/output contact plug 1303 may be separated from the second substrate 1310 in a direction parallel to the upper surface of the second substrate 1310. Also, the second input/output contact plug 1303 may pass through the interlayer insulating layer 1315 of the cell region CELL to be connected to the second input/output pad 1305. In an example embodiment, the second input/output pad 1305 may be electrically connected to the circuit element 1220*a*.

In an example embodiment, the first input/output pad 1205 and the second input/output pad 1305 may be selectively formed. For example, the nonvolatile memory device 1000 may include only the first input/output pad 1205 disposed on the first substrate 1201 or only the second input/output pad 1305 disposed on the second substrate 1301. In another example embodiment, the nonvolatile memory device 1000 may include both the first input/output pad 1205 and the second input/output pad 1305.

In each of the external pad bonding region PA and the bit line bonding region BLBA included in the cell region CELL and the peripheral circuit region PERI, a metal pattern of the uppermost metal layer exists as a dummy pattern, or, the uppermost metal layer may be empty.

In the nonvolatile memory device 1000 according to an example embodiment of the disclosure, in the external pad bonding region PA, a lower metal pattern 1273a having the same shape as that of the upper metal pattern 1372a of the cell region CELL may be formed on the uppermost metal layer of the peripheral circuit region PERI to correspond to the upper metal pattern 1372a formed on the uppermost metal layer of the cell region CELL. The lower metal pattern 1273a formed on the uppermost metal layer of the peripheral circuit region PERI may not be connected to a separate contact in the peripheral circuit region PERI. Similarly, in the external pad bonding region PA, an upper metal pattern having the same shape as that of the lower metal pattern of the peripheral circuit region PERI may be formed to correspond to the lower metal pattern formed on the uppermost metal layer of the peripheral circuit region PERI.

Lower bonding metals 1271b and 1272b may be formed on the second metal layer 1240b of the word line bonding region WLBA. In the word line bonding region WLBA, the lower bonding metals 1271b and 1272b of the peripheral circuit region PERI may be electrically connected to the upper bonding metals 1371b and 1372b of the cell region CELL by a bonding method.

Also, lower bonding metals 1251 and 1252 may be formed on the metal layer of the bit line bonding region BLBA. In the bit line bonding region BLBA, an upper metal pattern 1392 having the same shape as that of the lower metal pattern 1252 of the peripheral circuit region PERI may be formed on the uppermost metal layer of the cell region CELL to correspond to the lower metal pattern 1252 formed on the uppermost metal layer of the peripheral circuit region PERI. In an example embodiment, a contact may not be formed on the upper metal pattern 1392 formed on the uppermost metal layer of the cell region CELL.

In an example embodiment, a reinforced metal pattern having the same cross-sectional shape as that of the formed metal pattern may be formed on the uppermost metal layer of the other of the cell region CELL and the peripheral circuit region PERI to correspond to the metal pattern formed on the uppermost metal layer of one of the cell region CELL and the peripheral circuit region PERI.

In general, in the case of using a NAND flash memory device supporting plane independent read (PIR)/plane independent command (PIC) in mobile products in which it is difficult to use an RnB pin due to pad limitation, overhead of determining a ready & busy status of a plane using a command of the related art accounts for a large proportion of the overall performance. In a solid state driver (SSD) using CE controlled RnB, which reduces the number of required RnB pads, a NAND flash memory device supporting PIR/PIC does not use the corresponding technology.

One or more example embodiment of the disclosure provides a novel protocol of an extended command set for determining the status of each plane in a limited pin situation. In the method of determining a status of a plane of the disclosure, status values of all planes configured in a die within one command set may be checked only by toggle of/RE. The method of determining a plane status of the disclosure may eliminate repetitive overhead of the existing 73/78h command set. For example, the protocol of the disclosure may transmit a 77h command, toggle/RE by as much as the number of planes in a selected die after a predetermined time tWHR, and return DQS and DQ[7:0] as much as toggle after a predetermined time tDQSRE, thereby determining a plane status. Thus, the protocol provided in the disclosure may eliminate repetitive overhead.

In addition, one or more example embodiment of the disclosure provides a novel protocol of an extended command set for selectively determining a plane status.

In the method of determining a plane status of the disclosure, a status of a plane configured in a die may be selectively checked by transmitting a plane bitmap value in the address cycle (phase) in one command set. For example, according to the protocol of the disclosure, a plane status may be checked by transmitting the 79h command, transmitting bitmap information of the plane to be checked in the die selected in an address cycle, and toggling/RE by as much as the plane information to be read after the predetermined time tWHR, and returning DQ[7:0] having DQS as much as toggle and selected plane status information after the predetermined time tDQSRE.

In an example embodiment, a logical address may be allocated to the least significant bit (LSB) of a plane bitmap [0] in order from a first plane (LUNO plane 0). In the case of a NAND flash memory device with a DDP or higher, the address cycle for plane bitmap transmission may be added once more.

A storage device according to an example embodiment of the disclosure may include a controller including a NAND I/F (Interface) module supporting the novel extended command protocol and a NAND flash memory device supporting a plane independent command (PIC). In an example embodiment, the controller may include a fixed plane status determine processing logic (e.g., 77h command transmission and/RE toggle). In an example embodiment, the controller may include an optional plane status determine processing logic (e.g., 79h command transmission, plane bitmap ADDR transmission, and/RE toggle). In an example embodiment, the controller may include a FIFO memory storing a plane status.

In the storage device and the operating method thereof according to an example embodiment of the disclosure, all plane status values configured in a die may be checked by using/RE toggle corresponding to the number of planes in one command set. In an example embodiment, before using the extended command, a Get Feature command operation for determining the number of planes in the NAND Flash memory connected to the controller may be performed, and through this, a plane supporting the PIC implemented in the NAND flash memory may be checked. In an example embodiment, when there is no power cycle after determining the plane information one time, the plane information corresponding to the inside of the controller may be stored. In an example embodiment, before using the expansion command, the number of planes of the NAND flash memory may be stored in a nonvolatile memory (ROM) or E-FUSE in the controller. In addition,/RE toggle corresponding to the number of planes may be determined.

According to the storage device and an operating method thereof according to another example embodiment of the disclosure, a plane status, among the planes configured in a die, may be checked selectively by transmitting a plane bitmap value for determining a status in the address cycle (phase) in one command set.

In an example embodiment, the plane bitmap may be allocated to 8 bits of DQ[7:0]. For example, LSB DQ[0] and plane 0 may be mapped, and MSB DQ[7] and plane 7 may be mapped. The reverse is also possible. That is, LSB DQ[0] may be mapped to plane 7, and MSB DQ[7] may be mapped to plane 0.

Meanwhile, if the number of planes supported by the NAND flash memory configured in the storage device is 8 or more, the address cycle may be extended. For example, when the plane bitmap of plane #9 is intended to be transmitted, the plane bitmap may be transmitted as {ADDR Cycle 1} DQ[7:0]=8'h00, {ADDR Cycle 2} DQ[7:0]=8'h01.

That is, after the extended command <CMD 79h> is transmitted, the plane bitmap address <ADDR 1><ADDR 2> . . . <ADDR N> may be transmitted, and planes 8-15 and planes N−1 to N+6 may be selected by/RE toggle planes 0 to 7.

The storage device according to an example embodiment of the disclosure is expected to reduce the overhead of transmitting the status check command by as many as the number of planes to determine a status of individual planes of a NAND flash memory supporting the PIC operation, thereby improving performance. P Meanwhile, as described above, the plane status determine process has been described using the extended command protocol. The plane status determine method according to an example embodiment of the disclosure may be referred to as an At once Status Determine method compared to the related art.

According to the plane status determine method according to the example embodiment of the disclosure, by transmitting the At once Status check command, the Ready & Busy status information about all planes in the selected die may be easily checked through the data strobe signal (DQS) and the corresponding DQ[7:0] only by/RE toggle. The disclosure may solve the problem of the chip size of the RnB pad representing the state of one die or plane status per one RnB pad. In addition, the disclosure may overcome the overhead of returning commands and DQS/DQ[7:0] as many as the number of planes in the existing status determine method. In addition, the disclosure may overcome the limitation of not being able to determine the status for each plane in CE controlled RnB.

For example, according to the plane status determine method using the Read Status Enhanced command (assume 77h) of the new At once Status Determine method, when plane count 4 to be checked after sending the command 77h CMD is assumed, after the first/RE toggle, the second/RE toggle, the third/RE toggle, and the fourth/RE toggle, DQ[7:0] Plane 0 status is returned, DQ[7:0] Plane 1 status is returned, DQ[7:0] Plane 2 status is returned, and DQ[7:0] Plane 3 status is returned, thereby improving performance.

The disclosure discloses an improved 'At once Status check command' and Status Determine Protocol. Four plane statuses are checked through the new 'At once Status check command' 77h. First, after transmitting the newly defined 77h command, the number to determine the status may be transmitted, toggle (LOW→HIGH) strobe signal is generated with/Res by the corresponding number, and the NAND flash memory may make DQS by receiving the/RE signal and perform edge alignment of corresponding DQS, thereby returning a plane status value to the DQ[7:0] value.

For example, when the Plane Count requesting 4 pieces of plane information is set to 4,/RE toggle may be generated 4 times. The NAND flash memory may transfer the DQS return strobe corresponding to/RE to the controller and perform edge alignment to the DQS, thereby returning the status of Plane 0/1/2/3 to the DQ[7:0] value. The controller may read the plane status information by delaying the DQS to latch the DQ[7:0] value. For example, if the plane status value is 'E0h', it is Ready, and if the plane status value has another value, 'E1h' etc. is Busy or Error.

The nonvolatile memory device, the controller for controlling the same, the storage device having the same, and the operating method thereof according to an example embodiment of the disclosure output each plane status information through data lines using an extended status check command, thereby remarkably reducing the area, while obtaining plane information.

What is claimed is:

1. An operating method of a controller, the operating method comprising:
    transmitting an extended status check command to a nonvolatile memory device;
    after transmitting the extended status check command, toggling a read activation signal to correspond to a number of planes in the nonvolatile memory device; and
    receiving status information about one or more planes in the nonvolatile memory device through data lines according to a data strobe signal corresponding to the read activation signal.

2. The operating method of claim 1, further comprising determining the number of planes of the nonvolatile memory device.

3. The operating method of claim 2, wherein information corresponding to the number of planes is stored in a read only memory (ROM) or an E-fuse in the controller.

4. The operating method of claim 2, wherein the determining the number of planes comprises:
    transmitting a get feature command to the nonvolatile memory device;
    receiving plane number information from the nonvolatile memory device based on the get feature command; and
    storing the plane number information in a buffer memory.

5. The operating method of claim 1, wherein the read activation signal is output after a first period of time from a point in time when the extended status check command is received.

6. The operating method of claim 5, wherein the read activation signal is toggled after a read preamble time.

7. The operating method of claim 5, wherein the data strobe signal is toggled to correspond to the number of planes based on the read activation signal after an access window.

8. The operating method of claim 1, wherein, after the read activation signal is toggled, the read activation signal has a read postamble time until a chip activation signal, a command latch activation signal, and an address latch activation signal transition from a low level to a high level, and
    wherein the data strobe signal is toggled during the read postamble time.

9. The operating method of claim 8, wherein the read activation signal has a read postamble holding time to ensure a data output time after the read postamble time, and
    wherein the status information about the one or more planes comprises a last plane status information, which is maintained in the data lines during the read postamble holding time.

10. The operating method of claim 1, wherein the extended status check command is a 77h command.

11. An operating method of a controller, the operating method comprising:
    transmitting an extended status check command to a nonvolatile memory device;
    transmitting a plane bitmap value in an address cycle to the nonvolatile memory device, the plane bitmap indicating at least one plane, among a plurality of planes of the nonvolatile memory device;
    toggling a read activation signal to correspond to a number of planes indicated by the plane bitmap value; and
    receiving status information about the at least one plane indicated by the plane bitmap value according to a data strobe signal corresponding to the read activation signal through data lines.

12. The operating method of claim 11, wherein the read activation signal is output after a first time period from a point in time when the plane bitmap value is received.

13. The operating method of claim 11, wherein corresponding numbers of the planes are sequentially allocated from a least significant bit of the plane bitmap value.

14. The operating method of claim 11, wherein, when the number of planes exceeds 8, an address cycle corresponding to a number of exceeding planes is added.

15. The operating method of claim 11, wherein the extended status check command is a 79h command.

16. The operating method of claim 1, wherein the read activation signal is toggled based on the extended status check command.

17. The operating method of claim 1, wherein the extended status check command is transmitted through the data lines.

18. The operating method of claim 1, wherein the one or more planes comprises a plurality of planes, and
wherein the status information of each of the plurality of planes is transmitted consecutively through the data lines.

19. The operating method of claim 1, wherein the one or more planes comprises a plurality of planes, and
wherein the read activation signal is toggled a plurality of times corresponding to the plurality of planes in the nonvolatile memory device.

20. The operating method of claim 1, wherein the one or more planes comprises a plurality of planes, and
wherein the status information of each of the plurality of planes is transmitted consecutively through the data lines according to a plurality of data strobe signals corresponding to the read activation signal.

21. A controller comprising:
a nonvolatile memory interface circuit connected to a nonvolatile memory device through a plurality of control pins and data lines and configured to control the nonvolatile memory device; and
a memory device configured to store plane number information about the nonvolatile memory device,
wherein the nonvolatile memory interface circuit is configured to:
transmit an extended status check command to the nonvolatile memory device to determine a plane status of the nonvolatile memory device,
toggle a read activation signal to correspond to the plane number information, and
receive plane status information about the nonvolatile memory device through the data lines based on a data strobe signal corresponding to toggling of the read activation signal.

22. The controller of claim 21, wherein the nonvolatile memory interface circuit is further configured to:
transmit a get feature command to the nonvolatile memory device, and
receive plane independent read/plane independent command (PIR/PIC) information having the plane number information from the nonvolatile memory device according to the get feature command.

23. The controller of claim 21, wherein the memory device is implemented as a nonvolatile memory.

24. The controller of claim 21, further comprising:
a first-in first-out (FIFO) memory configured to store the plane status information,
wherein the nonvolatile memory interface circuit is further configured to transmit an input/output request having a plane independent command (PIC) to the nonvolatile memory device based on the plane status information.

25. The controller of claim 21, wherein the nonvolatile memory interface circuit is further configured to transmit an input/output request having a plane independent command (PIC) to the nonvolatile memory device based on status information about a plane selected from one or more planes of the nonvolatile memory device.

* * * * *